(12) United States Patent
Kwon et al.

(10) Patent No.: US 11,812,672 B2
(45) Date of Patent: Nov. 7, 2023

(54) QUANTUM COMPUTING DEVICE AND SYSTEM

(71) Applicant: Samsung Electronics Co., Ltd, Suwon-si (KR)

(72) Inventors: Hyeokshin Kwon, Seongnam-si (KR); Jaehyeong Lee, Seoul (KR); Insu Jeon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 72 days.

(21) Appl. No.: 17/227,661

(22) Filed: Apr. 12, 2021

(65) Prior Publication Data

US 2021/0328127 A1 Oct. 21, 2021

(30) Foreign Application Priority Data

Apr. 17, 2020 (KR) .................. 10-2020-0046880

(51) Int. Cl.
*H10N 60/12* (2023.01)
*G06N 10/00* (2022.01)
*H10N 60/80* (2023.01)

(52) U.S. Cl.
CPC ............. *H10N 60/12* (2023.02); *G06N 10/00* (2019.01); *H10N 60/805* (2023.02)

(58) Field of Classification Search
CPC ...... H01L 39/223; H01L 39/025; G06N 10/00
See application file for complete search history.

(56) References Cited

U.S. PATENT DOCUMENTS

| | | |
|---|---|---|
| 5,543,640 A | 8/1996 | Sutherland et al. |
| 6,348,699 B1 | 2/2002 | Zehe |
| 10,134,972 B2 | 11/2018 | Oliver et al. |
| 10,211,386 B2 | 2/2019 | Dial et al. |
| 10,304,005 B2 | 5/2019 | Chow et al. |
| 2016/0292586 A1 | 10/2016 | Rigetti et al. |
| 2016/0364653 A1 | 12/2016 | Chow et al. |
| 2018/0069288 A1 | 3/2018 | Minev et al. |

OTHER PUBLICATIONS

Blais, Alexandre, et al. "Cavity quantum electrodynamics for superconducting electrical circuits: An architecture for quantum computation." *Physical Review A* 69.6 (2004): (14 pages in English).

Schoelkopf, R. J., et al. "Wiring up quantum systems." *Nature* 451.7179 (2008): (6 pages in English).

Jerger, M., et al. "Spectroscopy of a qubit array via a single transmission line." arXiv:1102.0404v1 [cond-mat.supr-con] (Feb. 2, 2011): (3 pages in English).

(Continued)

*Primary Examiner* — Matthew L Reames
(74) *Attorney, Agent, or Firm* — NSIP Law

(57) ABSTRACT

Provided is a quantum computing device and system. The quantum computing device includes a first qubit chip, a readout cavity structure surrounding a first end part of the first qubit chip, and a storage cavity structure surrounding a second end part of the first qubit chip, wherein the first qubit chip includes a first readout antenna disposed within the readout cavity structure, a first storage antenna disposed in the storage cavity structure, and a first qubit element provided between the first readout antenna and the first storage antenna, and wherein the first qubit element is disposed between the readout cavity structure and the storage cavity structure.

35 Claims, 16 Drawing Sheets

(56) References Cited

OTHER PUBLICATIONS

Jerger, M., et al. "Readout of a qubit array via a single transmission line." *EPL (Europhysics Letters)* 96.4 (2011): (4 pages in English).
Axline et al., "A coaxial line architecture for integrating and scaling 3D cQED system," arXiv preprint arXiv: 1604.06514, Apr. 22, 2016. pp. 1-8.
Xu et al., "Single-loop realization of arbitrary non-adiabatic holonomic single-qubit quantum gates in a superconducting circuit," arXiv: 1804.07591v1, Apr. 20, 2018; pp. 1-12.
Brecht, et al., "Micromachined integrated quantum circuit containing a superconducting qubit." arXiv:1611.02166v1 ; Nov. 7, 2016: pp. 1-13.
Leghtas, et al., "Confining the state of light to a quantum manifold by engineered two-photon loss." arXiv:1412.4633v1; Dec. 15, 2014: pp. 1-29.
Extended European Search Report dated Oct. 15, 2021 in counterpart European Patent Application No. 21168574.8 (11 pages in English).

QUANTUM COMPUTING DEVICE AND SYSTEM

CROSS-REFERENCE TO RELATED APPLICATION

This application claims the benefit of Korean Patent Application No. 10-2020-0046880, filed on Apr. 17, 2020, in the Korean Intellectual Property Office, the disclosure of which is incorporated herein by reference in its entirety for all purposes.

BACKGROUND

1. Field

This disclosure relates to a quantum computing device and system.

2. Description of Related Art

Quantum computers are computational machinery that depend on or use quantum mechanical phenomena, such as quantum superposition and quantum entanglement, as operating principles to perform data processing, for example. A unit element (or information itself) capable of storing information using a quantum mechanical principle is called a quantum bit or qubit, which can be used as a basic unit of information in a quantum computer.

Bits used in classical information storage elements have a state of "0" or "1", but qubits may have a state of "0" and "1" at the same time due to the superposition phenomenon. In addition, interaction between qubits may be achieved by entanglement. Due to the nature of these qubits, $2^N$ information can be generated using N qubits. Therefore, as the number of qubits increases, the amount of information and the processing speed can be exponentially increased compared to classical processing using the classical information storage elements.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a quantum computing device includes a first qubit chip, a readout cavity structure surrounding a first end part of the first qubit chip, and a storage cavity structure surrounding a second end part of the first qubit chip, wherein the first qubit chip includes a first readout antenna disposed within the readout cavity structure, a first storage antenna disposed in the storage cavity structure, and a first qubit element provided between the first readout antenna and the first storage antenna, and wherein the first qubit element is disposed between the readout cavity structure and the storage cavity structure.

The first qubit chip may further include a first through pad facing the first qubit element, and a first through wiring electrically connecting to the first through pad, where the first through pad may be closer to the first qubit element than the first through wiring is to the first qubit element.

The quantum computing device may further include a bus chip provided between the readout cavity structure and the storage cavity structure, where the bus chip may include a connection pad configured to receive an electrical signal from outside the bus chip, a transmission pad facing the connection pad, and a transmission wiring electrically connected to the transmission pad, where the transmission wiring may be electrically connected to the first through wiring.

The transmission pad may be configured to capacitively couple with the connection pad with respect to the received electrical signal.

The first qubit chip may further include a first readout wiring electrically connecting the first readout antenna to the first qubit element, a first storage wiring electrically connecting the first storage antenna to the first qubit element, and a first qubit board provided on the bus chip, wherein the first qubit element, the first readout antenna, the first readout wiring, the first storage antenna, and the first storage wiring may be provided on the first qubit board.

The first qubit element may include a first superconducting material pattern, a dielectric film, and a second superconducting material pattern that are sequentially stacked, where the first superconducting material pattern, the dielectric layer, and the second superconducting material pattern may constitute a Josephson junction.

The first superconducting material pattern may be electrically connected to the first readout antenna by the first readout wiring, and the second superconducting material pattern may be electrically connected to the first storage antenna by the first storage wiring.

The first through pad may be configured to capacitively couple with the second superconducting material pattern.

The quantum computing device may further include a second qubit chip spaced apart from the first qubit chip, where the second qubit chip may further include a second readout antenna disposed in the readout cavity structure, a second storage antenna disposed in the storage cavity structure, a second qubit element provided between the second readout antenna and the second storage antenna, a second through pad facing the second qubit element, and a second through wiring electrically connecting to the second through pad, with the second through pad being closer to the second qubit element than the second through wiring is to the second qubit element, where the second qubit element may be disposed between the readout cavity structure and the storage cavity structure.

The bus chip may further include a high-frequency resonator provided between the first qubit chip and the second qubit chip, where the first qubit element and the second qubit element may each be coupled to the high-frequency resonator.

The transmission wiring may be electrically connected to the high-frequency resonator, where both ends of the high-frequency resonator may be electrically connected to the first through wiring and the second through wiring, respectively.

The bus chip, the first and second qubit chips, the readout cavity structure, and the storage cavity structure may be arranged in a lower sub-quantum computing device, where the quantum computing device may further, in an upper sub-quantum computing device that is provided on the lower sub-quantum computing device, another bus chip having a configuration of the bus chip, another first and second qubit chips having respective configurations of the first and second qubit chips, another readout cavity structure having a configuration of the readout cavity structure, and another storage cavity structure having a configuration of the storage cavity structure, and where the lower sub-quantum computing device may be connected by a connection wire to the upper sub-quantum computing device.

Each of the lower sub-quantum computing device and the upper sub-quantum computing device may include respective high-frequency resonators configured to form quantum entanglement between all qubits of the lower sub-quantum computing device and the upper sub-quantum computing device.

The quantum computing device may further include a bus chip provided between the readout cavity structure and the storage cavity structure.

The quantum computing device may further include a bus chip, wherein the bus chip may be arranged adjacent to an exterior facing sidewall of the readout cavity structure, the first qubit element may be configured between an interior facing sidewall of the readout cavity structure and an interior facing sidewall of the storage cavity structure, and the bus chip may be spatially distant from the first qubit element.

The quantum computing device may further include a second qubit chip spaced apart from the first qubit chip, where the second qubit chip may include a second qubit element arranged between the interior facing sidewall of the readout cavity structure and the interior facing sidewall of the storage cavity structure, and spatially distant from the bus chip, and where the second qubit chip may further include a second readout antenna disposed in the readout cavity structure, a second storage antenna disposed in the storage cavity structure.

The first and second qubit chips may include respective through wirings, configured to provide electrical contact from the bus chip to respective through pads of the first and second qubit chips, and the respective through pads may be configured to capacitively couple with respective superconducting material patterns of the first and second qubit elements.

The quantum computing device may further include a first connector coupled to the first readout antenna, where the first connector may be configured as an insertion into the readout cavity structure.

The first connector and the first readout antenna may face each other.

The readout cavity structure and the storage cavity structure may include a superconducting material.

The first readout antenna may extend toward the first qubit element such that a portion of the first readout antenna is disposed between the readout cavity structure and the storage cavity structure, and the first storage antenna may extend toward the first qubit element such that a portion of the first storage antenna is disposed between the readout cavity structure and the storage cavity structure.

The quantum computing device may further include a shielding film surrounding the first qubit chip between the readout cavity structure and the storage cavity structure, and the shielding film may include a superconducting material.

In one general aspect, a quantum computing device includes a bus chip extending in a first direction, a storage cavity structure spaced apart from the bus chip in a second direction intersecting with the first direction, a readout cavity structure provided between the bus chip and the storage cavity structure, and plural qubit chips sequentially arranged in the first direction on the bus chip, where the plural qubit chips respectively extend into the storage cavity structure in the second direction, including respectively extending through the readout cavity structure, the plural qubit chips each include a respective readout antenna disposed in the readout cavity structure, a respective storage antenna disposed in the storage cavity structure, and a respective qubit element provided between the respective readout antenna and the respective storage antenna, the bus chip includes plural high-frequency resonators provided respectively between the plural qubit chips, and each of the respective qubit elements are coupled with a respective high-frequency resonator of the plural high-frequency resonators.

The readout cavity structure may include plural readout cavities arranged in the first direction, the storage cavity structure may include plural storage cavities arranged in the first direction, the respective readout antennas may be respectively disposed in the plural readout cavities, the respective storage antennas may be respectively disposed in the plural storage cavities, where, within each of the plural qubit chips, the respective readout antenna and the respective qubit element may be electrically connected to each other, and where, within each of the plural qubit chips, the respective storage antenna and the respective qubit element may be electrically connected to each other.

The quantum computing device may further include respective connectors coupled to the respective readout antennas, where the respective connectors may be each configured as an insertion into the readout cavity structure to a corresponding readout cavity of the plural readout cavities.

Each of the plural qubit chips may include a through wiring coupled with a corresponding qubit element, and a connection wiring disposed between the through wiring and a corresponding high-frequency resonator, of the plural high-frequency resonators, and may be configured to electrically connect the through wiring to the corresponding high-frequency resonator.

For each of the plural qubit chips, the connection wiring may extend in the second direction from a respective area on the bus chip to a respective area between the readout cavity structure and the storage cavity structure.

The bus chip may further include a connection pad, a transmission pad facing the connection pad, and a transmission wiring provided between the transmission pad and a high-frequency resonator of the plural high-frequency resonators, where the transmission wiring may be electrically connected to the transmission pad, the high-frequency resonator, and the through wiring corresponding to a qubit chip of the plural qubit chips.

The respective qubit elements may be disposed between the readout cavity structure and the storage cavity structure.

The quantum computing device may further include an inner shielding film surrounding each of the plural qubit chips between the readout cavity structure and the storage cavity structure, and an outer shielding film collectively surrounding, for each one of the plural qubit chips, the bus chip and the each one of the plural qubit chips, where the inner shielding film and the outer shielding film may include a superconducting material.

In a general aspect, a quantum computing device includes a lower sub-quantum computing device including a first readout cavity structure and a first storage cavity structure respectively spaced apart from each other in a first direction, and plural first qubit chips each arranged in a second direction intersecting with the first direction, an upper sub-quantum computing device provided on the lower sub-quantum computing device and include a second readout cavity structure and a second storage cavity structure respectively spaced apart from each other in the first direction, and plural second qubit chips each arranged in the second direction intersecting with the first direction, and a connection wire configured to electrically connect the lower sub-quantum computing device to the upper sub-quantum computing device, where each of the plural first qubit chips may include a first readout antenna respectively provided in the first readout cavity structure, a first storage antenna respectively provided in the first storage cavity structure, and a respective first qubit element provided between the respectively provided first readout antenna and the respectively provided first storage antenna, and wherein each of the plural second qubit chips may include a second readout antenna respectively provided in the second readout cavity structure, a second storage antenna respectively provided in the second storage cavity structure, and a respective second qubit element provided between the respectively provided second readout antenna and the respectively provided second storage antenna.

The lower sub-quantum computing device may include a first bus chip extending in the second direction between the first readout cavity structure and the first storage cavity structure, the upper sub-quantum computing device may include a second bus chip extending in the second direction between the second readout cavity structure and the second storage cavity structure, the first bus chip may include a first connection pad, a first transmission pad facing the first connection pad, and a first transmission wiring electrically connected to the first transmission pad, the second bus chip may include a second connection pad, a second transmission pad facing the second connection pad, and a second transmission wiring electrically connected to the second transmission pad, where the connection wire may electrically connect the first connection pad and the second connection pad.

The lower sub-quantum computing device may include a first bus chip extending in the second direction away from the second readout cavity structure and the second storage cavity structure, the upper sub-quantum computing device may include a second bus chip extending in the second direction away from the second readout cavity structure and the second storage cavity structure, the first bus chip may include a first connection pad, a first transmission pad facing the first connection pad, and a first transmission wiring may electrically connect to the first transmission pad, the second bus chip may include a second connection pad, a second transmission pad facing the second connection pad, and a second transmission wiring electrically connected to the second transmission pad, and the connection wire may electrically connect the first connection pad and the second connection pad.

The connection wire may include a superconducting material.

The quantum computing device may further include an interlayer shielding film disposed between the lower sub-quantum computing device and the upper sub-quantum computing device, where the interlayer shielding film may include a superconducting material.

Other features and aspects will be apparent from the following detailed description, the drawings, and the claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
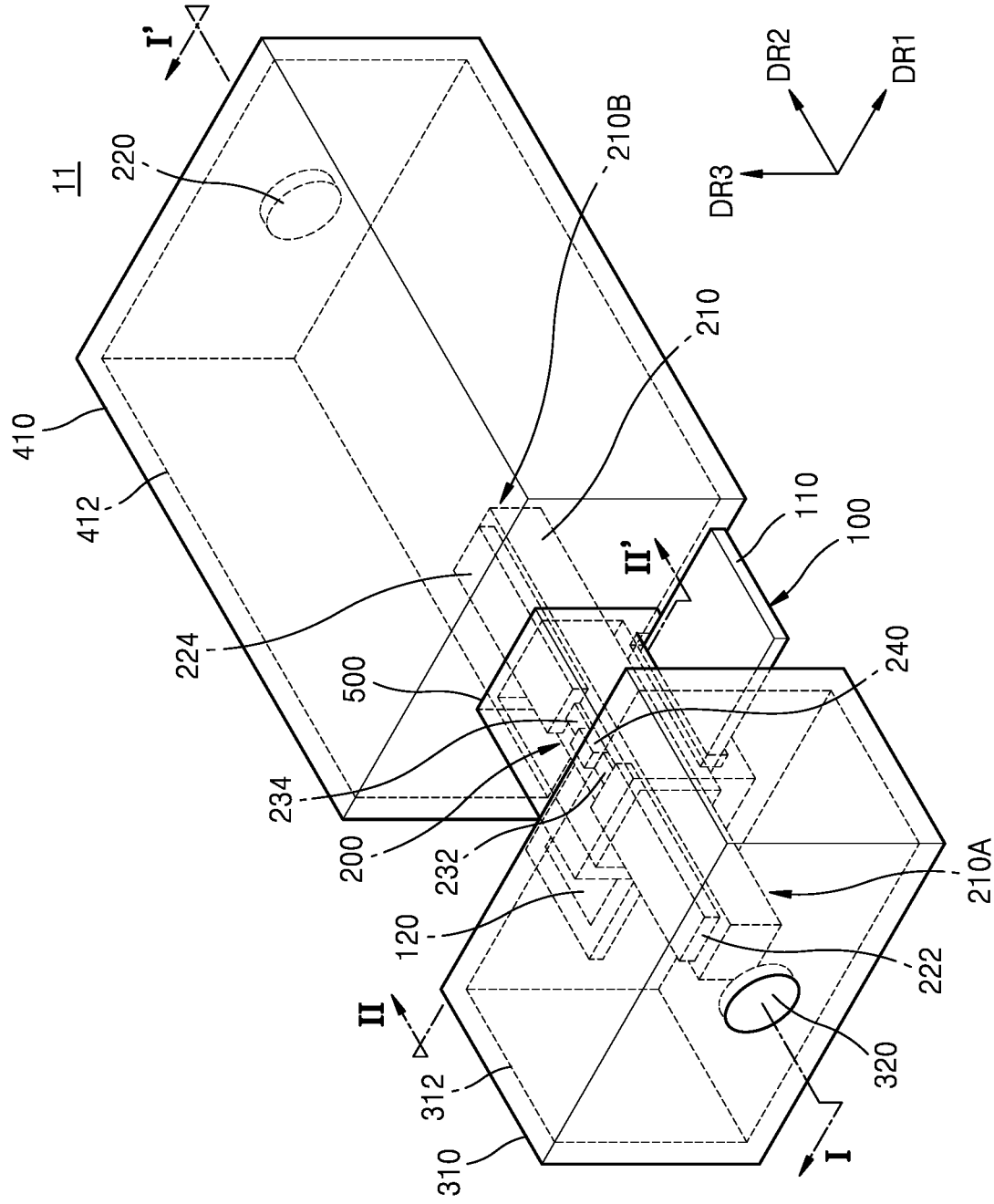
FIG. 1 is a perspective view of a quantum computing device according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are understood in the art, after an understanding of the disclosure of this application, may be omitted for increased clarity and conciseness.

Reference will now be made in detail to embodiments, examples of which are illustrated in the accompanying drawings, wherein like reference numerals refer to the like elements throughout, and the size of each component in the drawings may be exaggerated for clarity and convenience of description. In this regard, the one or more embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Throughout the descriptions of embodiments, when an element is referred to as being "connected" or "coupled" to another element, it can be directly connected or coupled to the other element, or can be electrically connected or coupled to the other element with intervening elements interposed therebetween. The terms "comprises" and/or "comprising" or "includes" and/or "including" when used in this specification, specify the presence of stated elements, but do not preclude the presence or addition of one or more other elements.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. Hereinafter, what is described as "upper" or "on" may include not only directly over in contact but also over not in contact, and what is described as "lower" or "below" may include not only directly below in contact but also not in contact.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples. Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

With respect to one or more embodiments described below, various types of qubits are available, including qubits that use a superconductor (that is, superconducting qubits), which may have an advantage in potential manufacture ease through semiconductor or integrated circuit techniques. For example, one or more embodiments may provide a quantum computing device or system having a high structural scalability.

Figure 2:
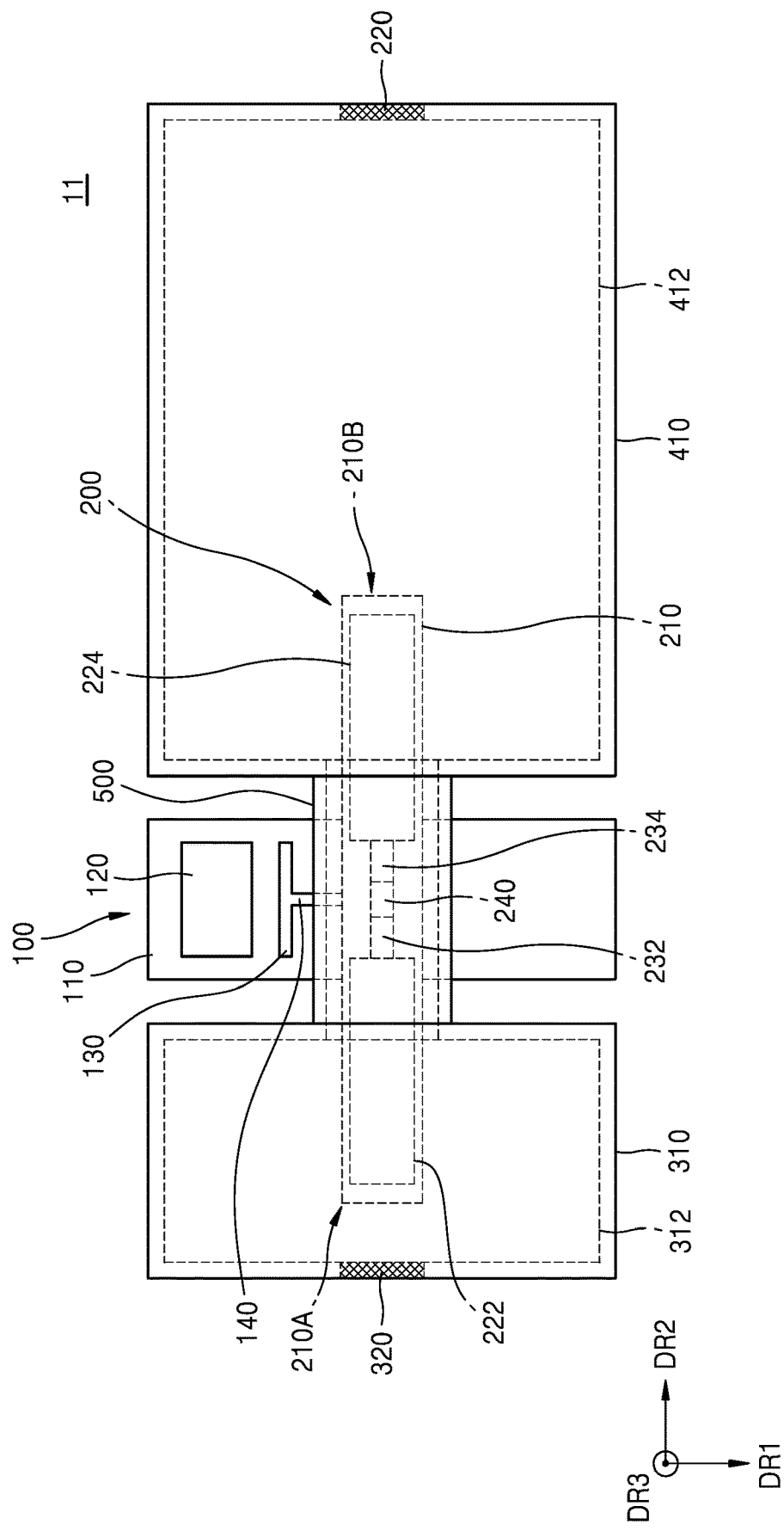
FIG. 2 is a plan view of the quantum computing device of FIG. 1.
Figure 3:
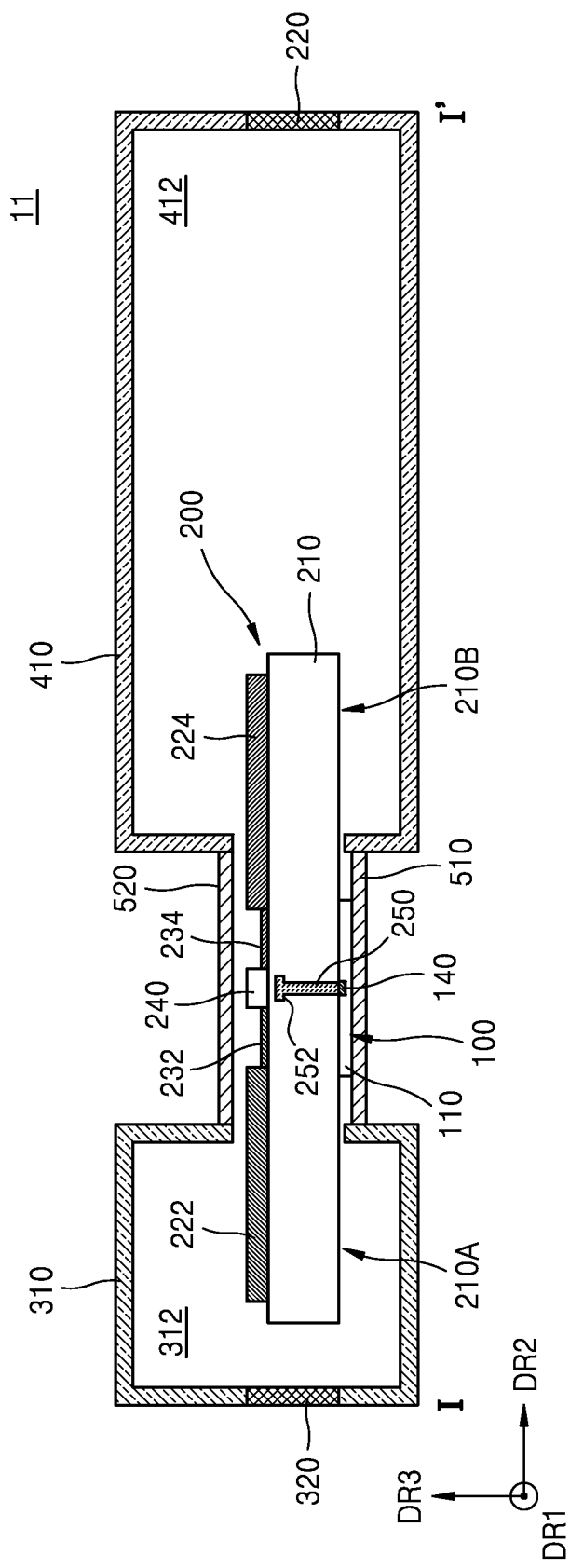
FIG. 3 is a cross-sectional view taken along line I-I' of the quantum computing device of FIG. 1.
Figure 4:
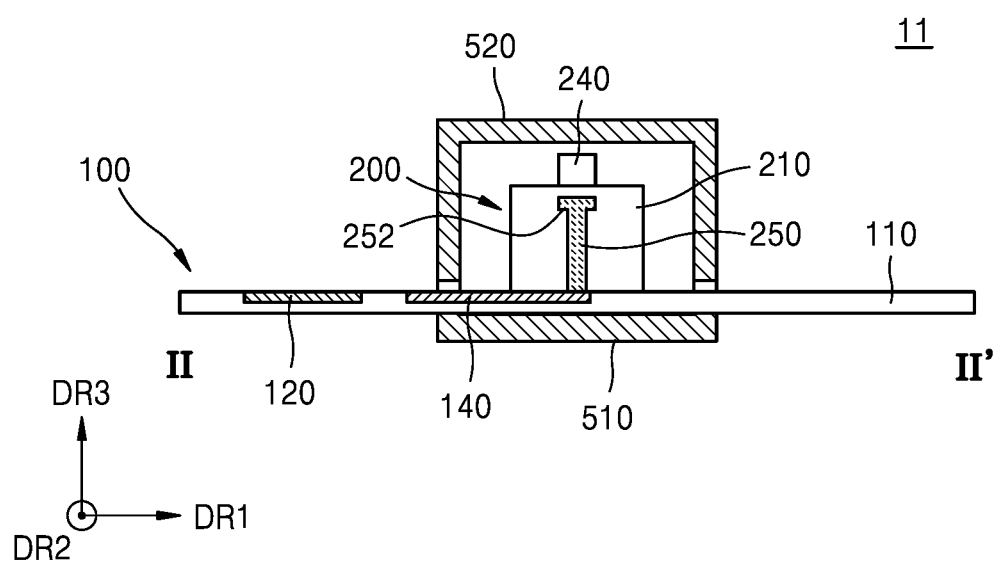
FIG. 4 is a cross-sectional view taken along line II-II' of the quantum computing device of FIG. 1.

FIG. 1 is a perspective view of a quantum computing device according to one or more embodiments. FIG. 2 is a plan view of the quantum computing device of FIG. 1. FIG. 3 is a cross-sectional view taken along line I-I' of the quantum computing device of FIG. 1. FIG. 4 is a cross-sectional view taken along line II-II' of the quantum computing device of FIG. 1.

Referring to FIGS. 1 to 4, a quantum computing device (or system) 11 may include a bus chip 100, a qubit chip 200, a readout cavity structure 310, a storage cavity structure 410, and an inner shielding film 500. The bus chip 100 may include a bus board 110, a connection pad 120, a transmission pad 130, and a transmission wiring 140. The bus chip 100 may provide a signal received from the outside of the quantum computing device 11 to the qubit chip 200, e.g., the signal received from the outside may be received at the connection pad 120, and provided to the qubit chip 200 through respective interactions between the connection pad 120 and the transmission pad 130, between the transmission pad 130 and the transmission wiring 140, and between the transmission wiring 140 and the qubit chip 200, for example. In an example, the bus board 110 may extend in a first direction, e.g., the illustrated first direction DR1, different from a second direction, e.g., the second direction DR2, in which the qubit chip 200 extends. The bus board 110 may include an insulating material. For example, the bus board 110 may include a silicon (Si) board or a sapphire board. The connection pad 120 may include a superconducting material. For example, the connection pad 120 may include aluminum (Al), niobium (Nb), indium (In), or a combination thereof, as non-limiting examples.

The transmission pad 130 may be spaced apart from the connection pad 120 in the first direction DR1, and an end or other portion of the transmission pad 130 may face an end or other portion of the connection pad 120. The transmission pad 130 may thus be configured to capacitively couple with connection pad 120. For example, the end or other portion of the transmission pad 130 may have a length in the second direction DR2 that may be substantially the same as a length in the second direction DR2 of the end or other portion of the connection pad 120. As a non-limiting example, the first direction DR1 and the second direction DR2 may be perpendicular to each other. In such an example, and as illustrated in FIG. 2, the length of the end or other portion of the transmission pad 130 in the second direction DR2 may be equal to the length of the end or other portion of the connection pad 120 in the second direction DR2, while the length of the connection pad 120 in the first direction DR1 may be substantially greater than the length of the transmission pad 130 in the first direction DR1. The transmission pad 130 may include a superconducting material. For example, the transmission pad 130 may include aluminum (Al), niobium (Nb), indium (In), or a combination thereof, as non-limiting examples.

The transmission wiring 140 may extend from the transmission pad 130 in the first direction DR1, e.g., the transmission wiring 140 may be electrically connected to the transmission pad 130. The transmission wiring 140 may directly contact transmission pad 130. For example, the transmission wiring 140 and the transmission pad 130 may be connected to each other without an interface therebetween. The transmission wiring 140 may include a superconducting material. For example, the transmission wiring 140 may include aluminum (Al), niobium (Nb), indium (In), and a combination thereof, as non-limiting examples.

The qubit chip 200 may have a through pad 252 and the transmission wiring 140 may interact with the through pad 252, which may be configured to interact, e.g., capacitively couple, with a Josephson Junction represented by the qubit element 240, as a non-limiting example. In addition, in an example where the quantum computing device includes a plurality of qubit chips 200 respectively arranged with respect to one bus chip 100, the one bus chip 100 may further include a plurality of high-frequency resonators 150, e.g., electrically connected or interacting with respective corresponding transmission wirings 140, such that respective high-frequency electromagnetic signals generated by the high-frequency resonators 150 may control formation of quantum entanglement between the respective plurality of qubits of the plurality of qubit chips 200. In an alternate example, the plurality of high-frequency resonators 150 may be arranged on a plurality of respective bus chips 100 corresponding to the plurality of qubit chips 200, as a non-limiting example. Still further, in an example the quantum computing device may be a quantum computing device or system that includes a plurality of quantum computing devices that each include such plurality of qubit chips 200. Such examples of the quantum computing device or system are further explained in greater detail below with respect to FIGS. 1 to 4 and further below with respect to FIGS. 5 to 16, for example.

Accordingly, the qubit chip 200 may include a qubit board 210, a readout antenna 222, a storage antenna 224, the qubit element 240, a readout wiring 232, a storage wiring 234, the through wiring 250, and the through pad 252. As illustrated in FIGS. 1 to 4, in an example, the qubit board 210 may be provided on the bus chip 100. For example, the qubit board 210 may extend in the second direction DR2, e.g., extending beyond one or more sides of the bus chip 100 in the second direction DR2. From a viewpoint in the third direction DR3, different from the first direction DR1 and the second direction DR2, the qubit board 210 may intersect with the bus chip 100. For example, when the first direction DR1 and the second direction DR2 are different directions in a same horizontal plane, as a non-limiting example, the third direction DR3 may be the vertical direction, and thus, the qubit board 210 may vertically overlap the bus chip 100. The qubit board 210 may include a first end part 210A and an opposite second end part 210B spaced apart from each other in the second direction DR2. From a viewpoint in the third direction DR3, the first end part 210A and the second end part 210B of the qubit board 210 may be spaced apart from each other with the bus chip 100 arranged therebetween, e.g., with the bus chip 100 extending along an example mid-line of the qubit board 210 in the first direction DR1. The qubit board 210 may include an insulating material. For example, the qubit board 210 may include a silicon (Si) board or a sapphire board.

The readout antenna 222 may be provided on the first end part 210A of the qubit board 210. For example, the readout antenna 222 may extend from the first end part 210A of the qubit board 210 toward the second end part 210B, e.g., extending to the example readout wiring 232. The readout antenna 222 may be capacitively coupled to the readout connector 320 described in greater detail below. The readout antenna 222 may be configured to receive a high frequency signal provided from the readout connector 320 and transmit a high frequency signal to the readout connector 320, e.g., operated to receive a high frequency signal or transmit a high frequency signal. The readout antenna 222 may include a superconducting material. For example, the readout antenna 222 may include aluminum (Al), niobium (Nb), indium (In), or a combination thereof, as non-limiting examples.

The storage antenna 224 may be provided on the second end part 210B of the qubit board 210. For example, the storage antenna 224 may extend from the second end part 210B toward the first end part 210A, e.g., extending to the example storage wiring 234. The storage antenna 224 may be capacitively coupled to the storage connector 220 described below. The storage antenna 224 may be configured to receive a high frequency signal provided from the storage connector 220 and transmit a high frequency signal to the storage connector 220, e.g., operated to receive a high frequency signal or transmit a high frequency signal. The storage antenna 224 may be disposed in a storage cavity 412, described in greater detail below, to increase the coherence state period duration time of the qubit element 240 and perform unitary operations. The storage antenna 224 may include a superconducting material. For example, the storage antenna 224 may include aluminum (Al), niobium (Nb), indium (In), or a combination thereof, as non-limiting examples.

As noted above, the qubit element 240 may be provided on the qubit board 210. The qubit element 240 may be representative of an element having a nonlinear coupling. For example, the qubit element 240 may be representative of the aforementioned example Josephson Junction. The Josephson Junction may include a first superconducting material pattern and a second superconducting material pattern facing each other, and a non-superconducting material pattern (e.g., dielectric film) or air gap between the first and second superconducting material patterns. Cooper pairs can tunnel the Josephson Junction. Cooper pairs may refer to electron pairs that do not receive electrical resistance within the superconducting material pattern. Thus, Cooper pairs can represent the same quantum state and can be expressed by the same wave function.

The readout wiring 232 may be provided between the readout antenna 222 and the qubit element 240. The readout wiring 232 may extend in the second direction DR2. The readout wiring 232 may be electrically connected to the readout antenna 222. For example, the readout wiring 232 may directly contact the readout antenna 222. In an example where the qubit element 240 includes the example Josephson Junction, the readout wiring 232 may be electrically connected to the first superconducting material pattern of the Josephson Junction. For example, the readout wiring 232 may directly contact the first superconducting material pattern. In one example, the readout wiring 232, the readout antenna 222, and the first superconducting material pattern may have a single structure. In other words, the readout wiring 232, the readout antenna 222, and the first superconducting material pattern may be connected to each other without an interface therebetween. The readout wiring 232 may include a superconducting material. For example, the readout wiring 232 may include aluminum (Al), niobium (Nb), indium (In), or a combination thereof, as non-limiting examples.

The storage wiring 234 may be provided between the storage antenna 224 and the qubit element 240. The storage wiring 234 may extend in the second direction DR2. The storage wiring 234 may be electrically connected to the storage antenna 224. For example, the storage wiring 234 may directly contact the storage antenna 224. In an example where the qubit element 240 includes the example Josephson Junction, the storage wiring 234 may be electrically connected to the second superconducting material pattern of the Josephson Junction. For example, the storage wiring 234 may directly contact the second superconducting material pattern. In one example, the storage wiring 234, the storage antenna 224, and the second superconducting material pattern may have a single structure. In other words, the storage wiring 234, the storage antenna 224, and the second superconducting material pattern may be connected to each other without an interface therebetween. The storage wiring 234 may include a superconducting material. For example, the storage wiring 234 may include aluminum (Al), niobium (Nb), indium (In), or a combination thereof, as non-limiting examples.

The through wiring 250 may be provided in the qubit board 210. The through wiring 250 may be provided under the qubit element 240. For example, the through wiring 250 may overlap the qubit element 240 in the third direction DR3. The through wiring 250 may extend to the through pad 252 in the third direction DR3 from a position having the same height as the bottom surface of the qubit board 210. As noted above, in an example the through wiring 250 may be electrically connected to the transmission wiring 140. For example, the through wiring 250 may penetrate the bottom surface of the qubit board 210 and directly contact the transmission wiring 140. The through wiring 250 may include a superconducting material. For example, the through wiring 250 may include aluminum (Al), niobium (Nb), indium (In), or a combination thereof, as non-limiting examples.

The through pad 252 may be provided on or at an end of the through wiring 250. Thus, the through pad 252 may be electrically connected to the through wiring 250. For example, the through pad 252 may directly contact the upper end part of the through wiring 250. In one example, the through pad 252 may have a single structure with the through wiring 250. In other words, the through pad 252 and the through wiring 250 may be connected to each other without an interface therebetween. In an example, as illustrated in FIG. 4, the through pad 252 may have a larger perimeter or diameter than the through wiring 250, e.g., compared respectively along the third direction DR3. Said another way, for example, the width of the through pad 252 in the first direction DR1 or the second direction DR2 may be greater than a width of the through wiring 250 respectively in the first direction DR1 or the second direction DR2. The through pad 252 may be proximate to or face the qubit element 240, e.g., with the through pad being configured with respect to the qubit element 240 to capacitively couple with the qubit element 240. In an example where the qubit element 240 includes a Josephson Junction, the through pad 252 may be capacitively coupled to the lower superconducting material pattern of the Josephson Junction. The through pad 252 may include a superconducting material. For example, the through pad 252 may include aluminum (Al), niobium (Nb), indium (In), or a combination thereof, as non-limiting examples.

The readout cavity structure 310 may surround at least a portion of the first end part 210A of the qubit chip 200, e.g., the readout cavity structure 310 may encapsulate at least a portion or all of the readout antenna 222. The readout cavity structure 310 can define a readout cavity 312 therein. Through configuration of the readout cavity structure 310, the readout cavity 312 may be configured to be an element for readout of the qubit and for increasing the coherence state period duration time of the qubit, as only an example. The readout cavity structure 310 may include a superconducting material. For example, the readout cavity structure 310 may include aluminum (Al), niobium (Nb), indium (In), or a combination thereof, as non-limiting examples.

The readout connector 320 may be provided in or at the readout cavity structure 310. The readout connector 320 may be configured to access, pass through, or penetrate the readout cavity structure 310, e.g., in a manner that maintains or provides the benefits of the increase in coherence state period duration time by the configured encapsulating of the portion or all of the readout antenna 222 by the readout cavity structure 310. Accordingly, the readout connector 320 can provide a capability to access the readout cavity 312. For example, the readout connector 320 may be aligned or face the readout antenna 222 in the second direction DR2, and may be configured to capacitively couple with the readout antenna 222. The readout connector 320 may thus also be configured to receive an electrical signal from a device external to the quantum computing device 11. The readout connector 320 may be configured to convert an electrical signal into an electromagnetic wave signal having a high frequency. The location of the readout connector 320 may be determined according to the strength of the coupling between the high frequency signal and the readout cavity 312.

The storage cavity structure 410 may be spaced apart from the readout cavity structure 310 in the second direction DR2. For example, the storage cavity structure 410 may surround at least a portion of the second end part 210B of the qubit chip 200, e.g., the storage cavity structure 410 may encapsulate at least a portion or all of the storage antenna 224. The storage cavity structure 410 may define a storage cavity 412 therein.

Through configuration of the storage cavity structure 410, the storage cavity 412 may be configured to be an element for performing a unitary operation using the qubit and for containing information of the qubit, as only an example. Quantum information may be stored longer in the storage cavity 412. The storage cavity structure 410 may include a superconducting material. For example, the storage cavity structure 410 may include aluminum (Al), niobium (Nb), indium (In), or a combination thereof, as non-limiting examples.

The storage connector 220 may be provided in or at the storage cavity structure 410. The storage connector 220 may be configured to access, pass through, or penetrate the storage cavity structure 410, e.g., in a manner that maintains or provides the benefits of the increase in coherence state period duration time by the configured encapsulating of the portion or all of the storage antenna 224 by the storage cavity structure 410. Accordingly, the storage connector 220 can provide the capability to access the storage cavity 412. For example, the storage connector 220 may be aligned or face the storage antenna 224 in the second direction DR2, and may be configured to capacitively couple with the storage antenna 224. The storage connector 220 may thus also be configured to receive an electrical signal from a device external to the quantum computing device 11. For example, an input signal for controlling qubit and storaging information may be input from the outside of the quantum computing device 11 through the storage connector 220. The storage connector 220 may be configured to convert an electrical signal into an electromagnetic wave signal having a high frequency. The number of storage connector 220 is not limited to one, and may be determined as needed. The location of the storage connector 220 may be determined according to the strength of the coupling between the high frequency signal and the storage cavity 412.

An inner shielding film 500 may be provided between the readout cavity structure 310 and the storage cavity structure 410. For example, the inner shielding film 500 may cover a portion of the bus chip 100 and a portion of the qubit chip 200, e.g., the portion of the qubit chip 200 not already covered by the readout cavity structure 310 and the storage cavity structure 410, and thus may provide a benefit that the bus chip 100 and the qubit chip 200 may not be affected by unintended electromagnetic waves. In an example, the inner shielding film 500 may completely surround or encapsulate the bus chip 100 and the qubit chip 200 respective portions between the readout cavity structure 310 and the storage cavity structure 410. For example, the inner shielding film 500 may have a lower inner shielding film 510 and an upper inner shielding film 520, and may provide an additional example where the upper inner shielding film 520 additionally extends to cover remaining sides of the qubit chip 200, e.g., between adjacent end parts of the lower inner shielding film 510 and the upper inner shielding film 520 to fully surround or encapsulate the qubit chip 200 portion including the qubit element 240 and a portion of the bus chip 100 overlapped by the qubit chip 200. In such a non-limiting example, the lower inner shielding film 510 may contact and support the bus chip 100 under the bus chip 100. The shielding films (e.g., the lower inner shielding film 510 and the upper inner shielding film 520) may be or include a superconducting material. For example, the shielding films may include aluminum (Al), niobium (Nb), indium (In), or a combination thereof, as non-limiting examples.

As discussed above with respect to FIGS. 1 to 4, as well as with respect to the below FIGS. 5 to 16, a quantum computing device may include a bus chip, extending in a first direction at least between a readout cavity structure and a storage cavity structure, and qubit chip disposed on the bus chip and reaching into the readout cavity structure and reaching into the storage cavity structure.

In one or more embodiments, such a quantum computing device may include the bus chip, and the qubit chip extending in a different second direction, where the qubit chip includes a qubit element representing the qubit element being formed by an first superconducting material pattern connected to an antenna that is at least partially arranged in the readout cavity structure, and a second superconducting material pattern connected to another antenna that is at least partially arranged in the storage cavity structure. The qubit chip may include an electrical connection to the bus chip that is configured to influence the qubit formation. For the influence of the qubit formation, the electrical connection may include a through wiring and a through pad in the qubit chip being configured for capacitive coupling with the second superconducting material. A remaining portion of the qubit chip, including the qubit element and between the readout cavity structure and the storage cavity structure, may be encapsulated by an inner shielding film that may also cover a portion of the bus chip vertically overlapped by the qubit chip. A portion of the inner shielding film may also support the bus chip. A quantum computing system may include two or more of the qubits chip, the readout cavity, the storage cavity, and high-frequency resonators for control of quantum entanglement formation between the respective two or more qubits of the two or more qubit chips.

Thus, when the numbers of qubit chips, readout cavities, and storage cavities, for example, are further increased, the above quantum computing device or system descriptions may be further applicable to understand implementation of various example multi-qubit structures. Further example quantum computing devices or systems having such multi-qubit structures will be described in greater detail below. Accordingly, various embodiments of the present disclosure may provide a quantum computing device and system with high structural scalability.

Figure 5:
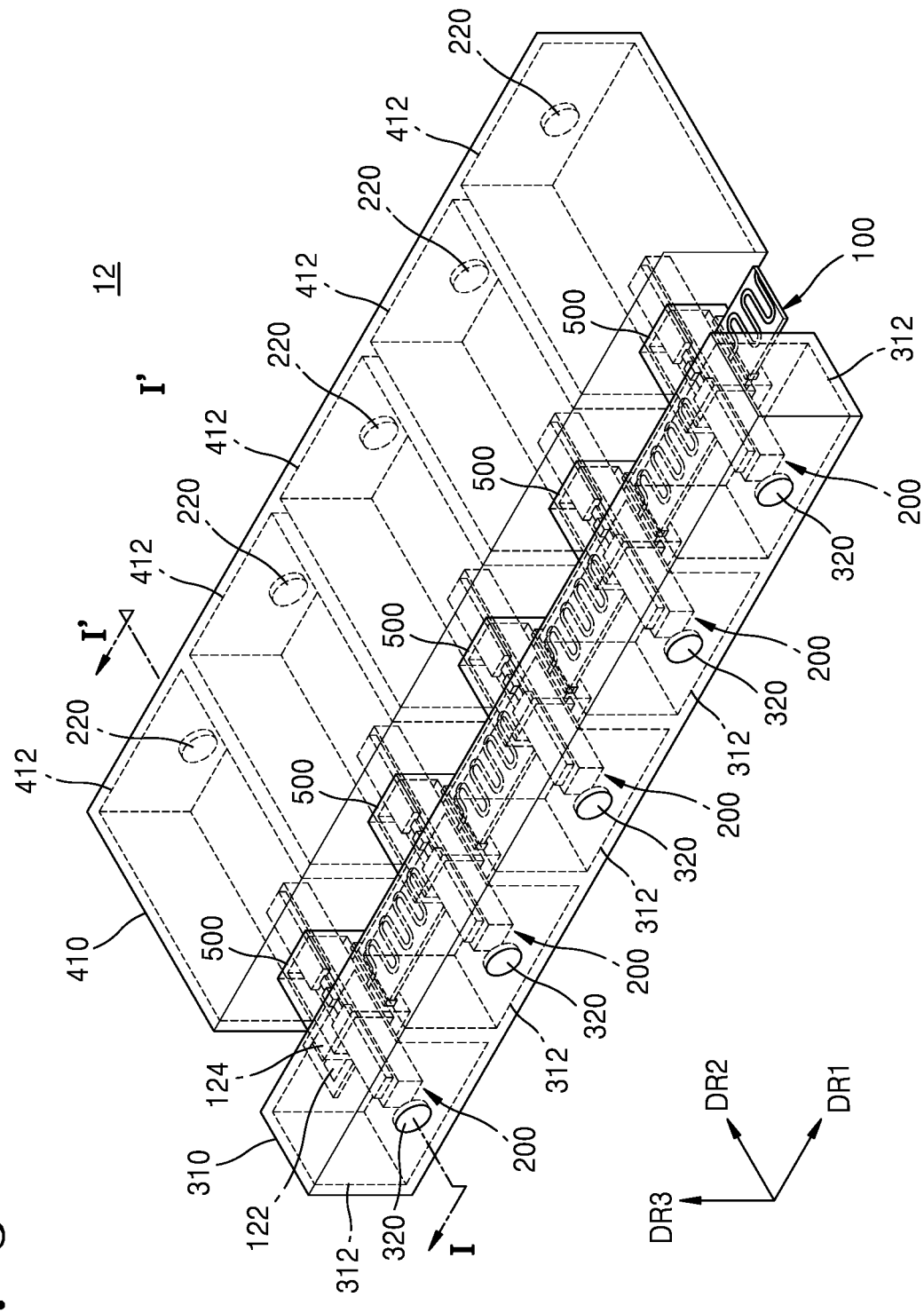
FIG. 5 is a perspective view of a quantum computing device according to one or more embodiments.
Figure 6:
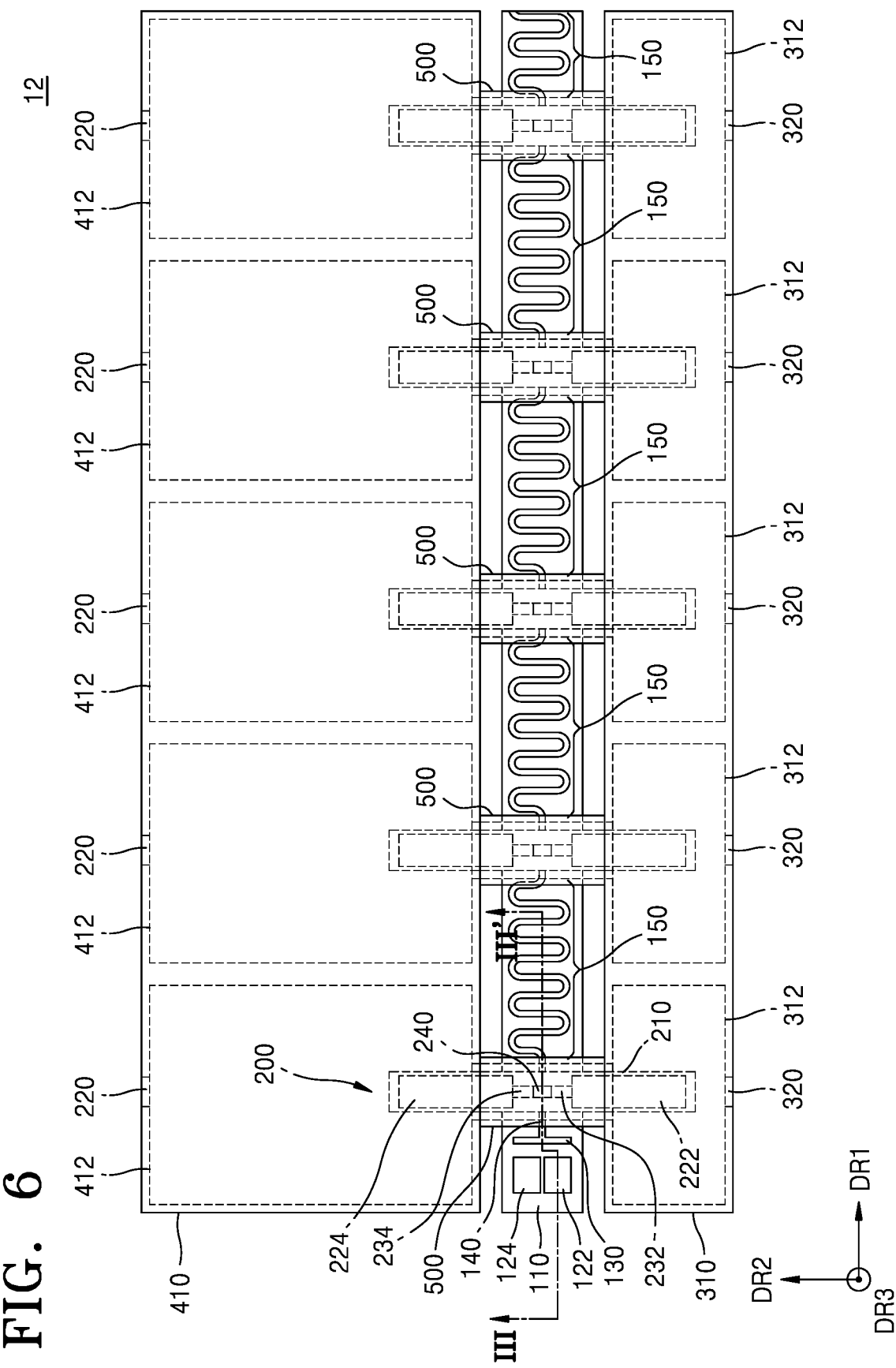
FIG. 6 is a plan view of the quantum computing device of FIG. 5.
Figure 7:
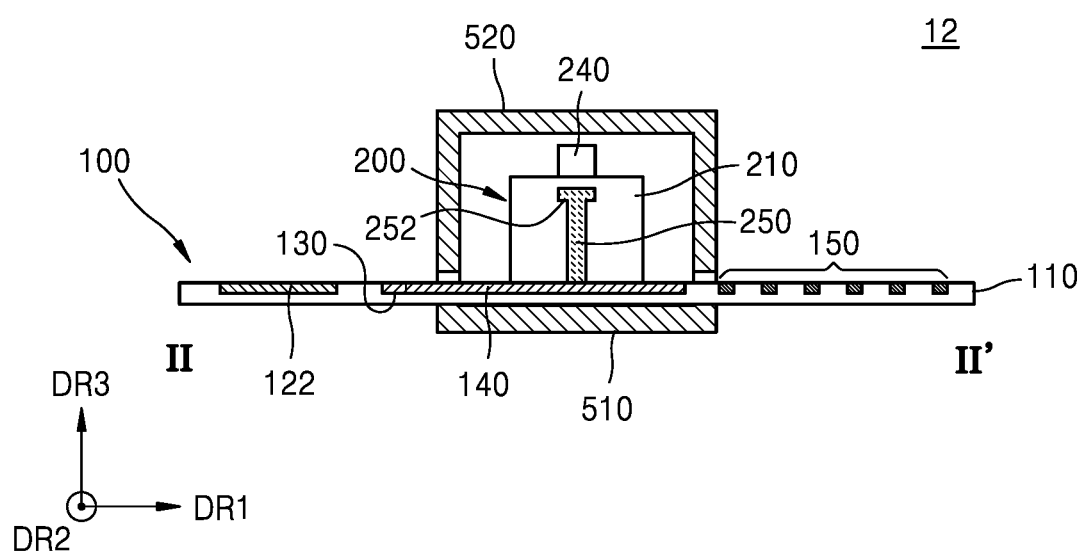
FIG. 7 is a cross-sectional view taken along line III-III' of the quantum computing device of FIG. 6.

FIG. 5 is a perspective view of a quantum computing device according to one or more embodiments. FIG. 6 is a plan view of the quantum computing device of FIG. 5. FIG. 7 is a cross-sectional view taken along line III-III' of the quantum computing device of FIG. 6. For conciseness of description, descriptions as those given with reference to FIGS. 1 to 4 are applicable for same reference numbers, except where indicated otherwise, and accordingly descriptions from the same will not be repeated below.

Referring to FIGS. 5 to 7, a quantum computing device (or system) 12 may include a bus chip 100, a plurality of qubit chips 200, a readout cavity structure 310, a storage cavity structure 410, and a plurality of inner shielding films 500. The bus chip 100 may include a bus board 110, a first connection pad 122, a second connection pad 124, a transmission pad 130, a transmission wiring 140, and high-frequency resonators 150.

Descriptions of the bus board 110, the connection pad 120, the transmission pad 130, and the transmission wiring 140 with respect to FIGS. 1 to 4 are respectively applicable to the bus board 110, the first connection pad 122, the transmission pad 130, and the transmission wiring 140 with respect to FIGS. 5 to 7, and thus descriptions from the same will not be repeated below.

The second connection pad 124 may be a bonding area, as a non-limiting example, configured for connection/bonding with a connection wire connecting the bus chip 100 of the quantum computing device 12 to the bus chip of another quantum computing device other than the quantum computing device 12. The second connection pad 124 may include a superconducting material. For example, the second connection pad 124 may include aluminum (Al), niobium (Nb), indium (In), or a combination thereof, as non-limiting examples.

The high-frequency resonators 150 may be provided between the qubit chips 200, respectively. The high-frequency resonators 150 may each include LC resonators for electromagnetic signals having high frequencies. The high-frequency resonators 150 may include elements and configurations for forming quantum entanglement between the respective qubits of the qubit chips 200. The shape, arrangement, or form of each of the high-frequency resonators 150 is not limited to that shown. Various shapes, arrangements, and forms of the high-frequency resonators 150 are included in examples, having respective LC resonator functions for various electromagnetic signals having high frequencies. The high-frequency resonators 150 may be sequentially arranged in the first direction DR1. The high-frequency resonators 150 may be electrically connected in series with each other. For example, the high-frequency resonators 150 directly adjacent to each other may directly contact each other. The respective transmission wirings 140 and the high-frequency resonators 150 directly adjacent to each other may be electrically connected. For example, the respective transmission wirings 140 and the high-frequency resonator 150 directly adjacent to each other may directly contact each other.

The qubit chips 200 may be sequentially arranged in the first direction DR1, respectively disposed between the high-frequency resonators 150. Descriptions of the qubit chip 200 provided above with reference to FIGS. 1 to 4 are applicable to each of the qubit chips 200 of FIGS. 5 to 7, in view of the discussions herein with respect to the aspects of the quantum computing device 12, and thus descriptions from the same will not be repeated below. However, each of the through wirings 250 of each of the qubit chips 200 may be electrically connected to a corresponding adjacent high-frequency resonator 150. For example, each through wiring 250 may directly contact an area of the bus board 110 to which the high-frequency resonators 150 directly adjacent to each other are connected.

In addition, in an example, the readout cavity structure 310 may be configured to provide a plurality of readout cavities 312, with respective readout antennas 222 being respectively disposed in the corresponding readout cavities 312. In addition, although FIGS. 5 and 6 illustrate a plurality of readout cavities 312 arranged in one readout cavity structure 310, embodiments are not limited thereto. For example, in other embodiments, the readout cavities 312 may be disposed within a plurality of readout cavity structures, respectively.

Readout connectors 320 may be respectively provided in or at the readout cavity structure 310. For example, each readout connector 320 may be configured to access, pass through, or penetrate the readout cavity structure 310, such as discussed above with respect to FIGS. 1 to 4. Thus, the readout connectors 320 may each provide a capability to access respective readout cavities 312. The readout connectors 320 may be aligned or face readout antennas 222 extended in the second direction DR2, respectively. The readout connectors 320 may be configured for capacitive coupling to the readout antennas 222, respectively.

The storage cavity structure 410 may be configured to provide the storage cavities 412, with respective storage antennas 224 being respectively disposed in the corresponding storage cavities 412. In addition, although FIGS. 5 to 6 illustrate a plurality of storage cavities 412 arranged in one storage cavity structure 410, embodiments are not limited thereto. For example, in other embodiments, the storage cavities 412 may be disposed within a plurality of storage cavity structures, respectively.

Storage connectors 220 may be respectively provided in or at the storage cavity structure 410. For example, each storage connector 220 may be configured to access, pass through, or penetrate the storage cavity structure 410, such as discussed above with respect to FIGS. 1 to 4. Thus, the storage connectors 220 may each provide a capability to access respective storage cavities 412. The storage connectors 220 may be aligned or face storage antennas 224 extended in the second direction DR2, respectively. The storage connectors 220 may be configured for capacitive coupling to the storage antennas 224, respectively.

Inner shielding films 500 may be provided between the readout cavity structure 310 and the storage cavity structure 410. The inner shielding films 500 may respectively cover the qubit chips 200. The bus chip 100 may extend to penetrate the inner shielding films 500. The high-frequency resonators 150 may be exposed between the inner shielding films 500. Further discussions above regarding shielding examples of FIGS. 1 to 4 are also applicable with respect to shielding examples of FIGS. 5 to 7.

Quantum entanglement may occur between the qubits of the quantum computing device 12.

Thus, in accordance with one or more embodiments and descriptions of FIGS. 1 to 7, as well as the below descriptions of FIGS. 8 to 16, a quantum computing device or system may include a plurality of qubit chips, readout cavities, and storage cavities arranged in a first direction. Plural qubit chips, plural readout cavities, and plural storage cavities are available, noting that examples are no not limited to the brief descriptions herein. Examples include additional or fewer respective numbers of qubit chips, readout cavities, and storage cavities. Accordingly, various embodiments of the present disclosure may provide quantum computing devices and systems with high structural scalability.

Figure 8:
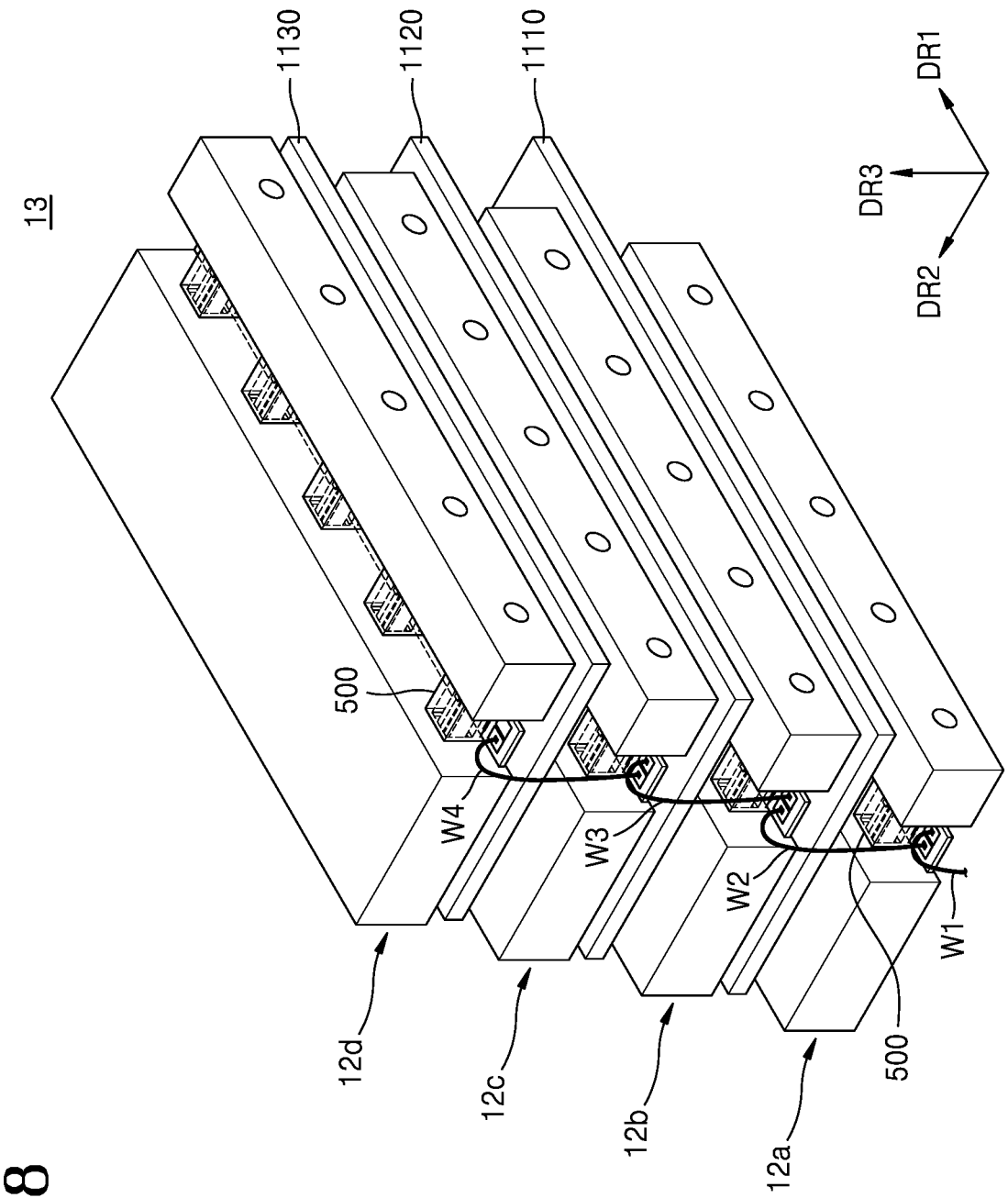
FIG. 8 is a perspective view of a quantum computing device according to one or more embodiments.

FIG. 8 is a perspective view of a quantum computing device 13 according to one or more embodiments. For conciseness of description, descriptions with respect to FIGS. 1 to 7 and 16, as non-limiting examples, are applicable for same and related reference numbers, except where indicated otherwise below, and accordingly descriptions for the same will not be repeated below.

Referring to FIG. 8, a quantum computing device (or system) 13 may include a first sub-quantum computing device 12a, a second sub-quantum computing device 12b, a third sub-quantum computing device 12c, a fourth sub-quantum computing device 12d, a first interlayer shielding film 1110, a second interlayer shielding film 1120, a third interlayer shielding film 1130, a first wire W1, a second wire W2, a third wire W3, and a fourth wire W4.

Each of the first to fourth sub-quantum computing devices 12a, 12b, 12c, and 12d may each be the same or respectively correspond to any of the examples described above with respect to the quantum computing device 12 described with reference to FIGS. 5 to 7, for example, and each may correspond to the any of above quantum computing device descriptions with respect to FIGS. 1 to 4 regarding multi-qubit devices or systems. The first to fourth sub-quantum computing devices 12a, 12b, 12c, and 12d may be arranged in the third direction DR3. The first to fourth sub-quantum computing devices 12a, 12b, 12c, and 12d may be arranged in a stair form, for example. From the viewpoint in the third direction DR3, the first connection pad 122 and the second connection pad 124 of the sub-quantum computing device (e.g., the first sub-quantum computing device 12a) disposed at a low position may be partially exposed by the step shift of the next a sub-quantum computing device (e.g., the second sub-quantum computing device 12b) disposed at a higher position.

The first to third interlayer shielding films 1110, 1120, and 1130 may be disposed between the first to fourth sub-quantum computing devices 12a, 12b, 12c, and 12d. The first to third interlayer shielding films 1110, 1120, and 1130 may be configured to block unintended electromagnetic waves from being transmitted and received respectively between any of the first to fourth sub-quantum computing devices 12a, 12b, 12c, and 12d. The first to third interlayer shielding films 1110, 1120, and 1130 may be or include a superconducting material. For example, the first to third interlayer shielding films 1110, 1120, and 1130 may each include aluminum (Al), niobium (Nb), indium (In), or a combination thereof, as non-limiting examples.

In an example, the first wire W1 is electrically connected to a high frequency electric signal generation device outside the quantum computing device (system) 13, or outside the first to fourth sub-quantum computing devices 12a, 12b, 12c, and 12d, and also connected to the first connection pad 122 of the first sub-quantum computing device 12a, thereby receiving the high frequency electric signal. The first wire W1 may apply the electrical signal generated by the high frequency electrical signal generation device to any one of the first connection pad 122 and the second connection pad 124 of the first sub-quantum computing device 12a.

The second wire W2 may electrically connect the other of the first connection pad 122 and the second connection pad 124 of the first sub-quantum computing device 12a to any one of the first connection pad 122 and the second connection pad 124 of the second sub-quantum computing device 12b.

The third wire W3 may electrically connect the other of the first connection pad 122 and the second connection pad 124 of the second sub-quantum computing device 12b to any one of the first connection pad 122 and the second connection pad 124 of the third sub-quantum computing device 12c.

The fourth wire W4 may electrically connect the other of the first connection pad 122 and the second connection pad 124 of the third sub-quantum computing device 12c to any one of the first connection pad 122 and the second connection pad 124 of the fourth sub-quantum computing device 12d.

The second to fourth wires W2, W3, and W4 may provide electrical signals generated by the high-frequency electric signal generation device to the second to fourth sub-quantum computing devices 12b, 12c, and 12d, respectively. The first to fourth wires W1, W2, W3, and W4 may each include a superconducting material. For example, the first to fourth wires W1, W2, W3, and W4 may each include aluminum (Al), niobium (Nb), indium (In), or a combination thereof, as non-limiting examples.

Thus, in accordance with one or more embodiments and descriptions of FIGS. 1 to 8, as well as the below descriptions of FIGS. 9 to 16, quantum entanglement may occur between qubits of a quantum computing device or system, including a quantum computing system that may include a plurality of quantum computing devices, e.g., stacked in a third direction. Each of the plural quantum computing devices may include a plurality of qubit chips 200, readout cavities 312, and storage cavities 412 arranged in a first direction. While a quantum computing device or system with an example plurality of quantum computing devices is discussed for explanation, embodiments are not limited thereto. The number of qubit chips in any one of the quantum computing devices is not limited to the example disclosure herein, the number of qubit chips are not required to be the same in different steps of quantum computing devices, and the number of steps of quantum computing devices also are not limited to the disclosure herein, as various examples exist with various number of steps. Thus, one or more embodiments demonstrate examples that may provide a quantum computing device or system with high structural scalability.

Figure 9:
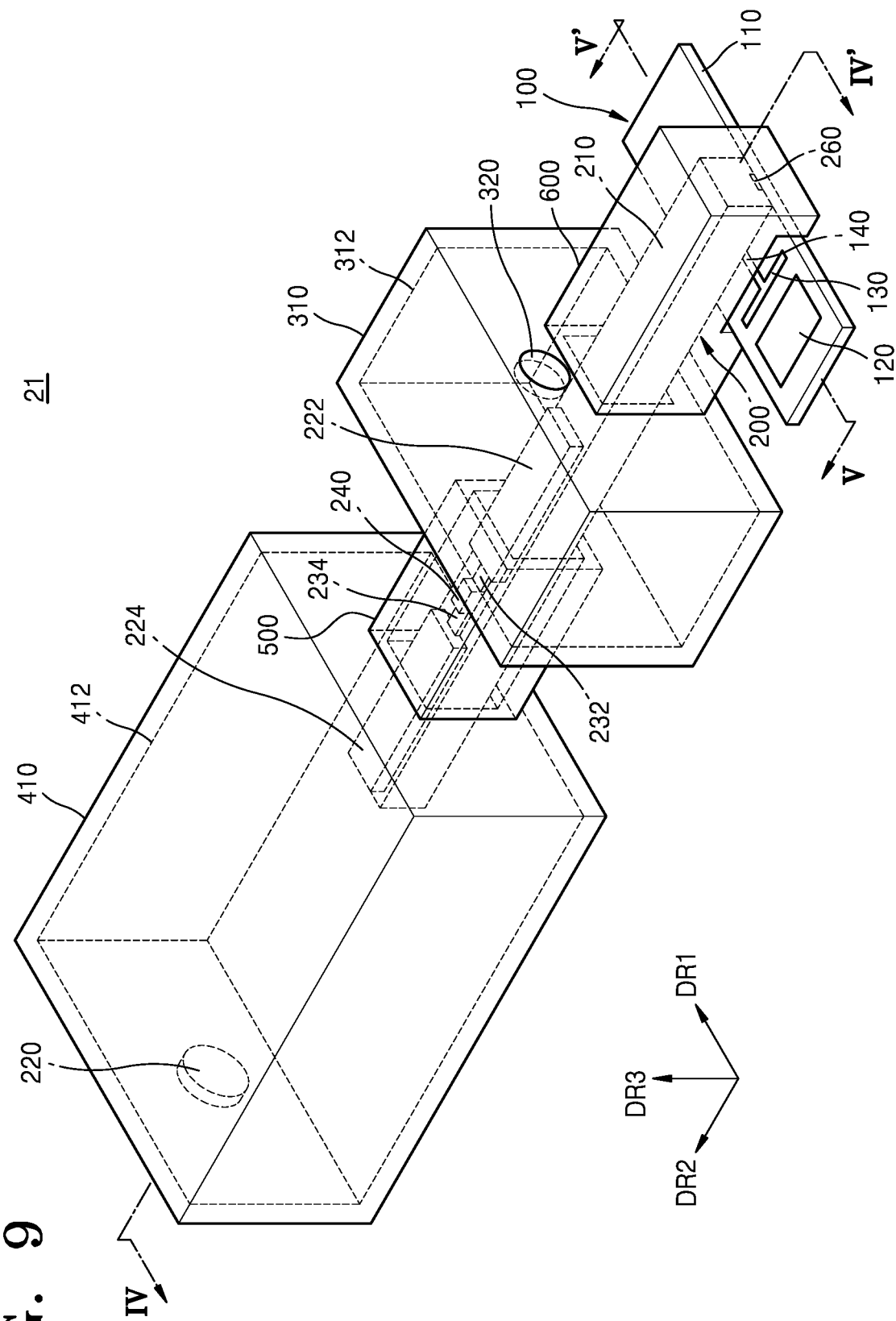
FIG. 9 is a perspective view of a quantum computing device according to one or more embodiments.
Figure 10:
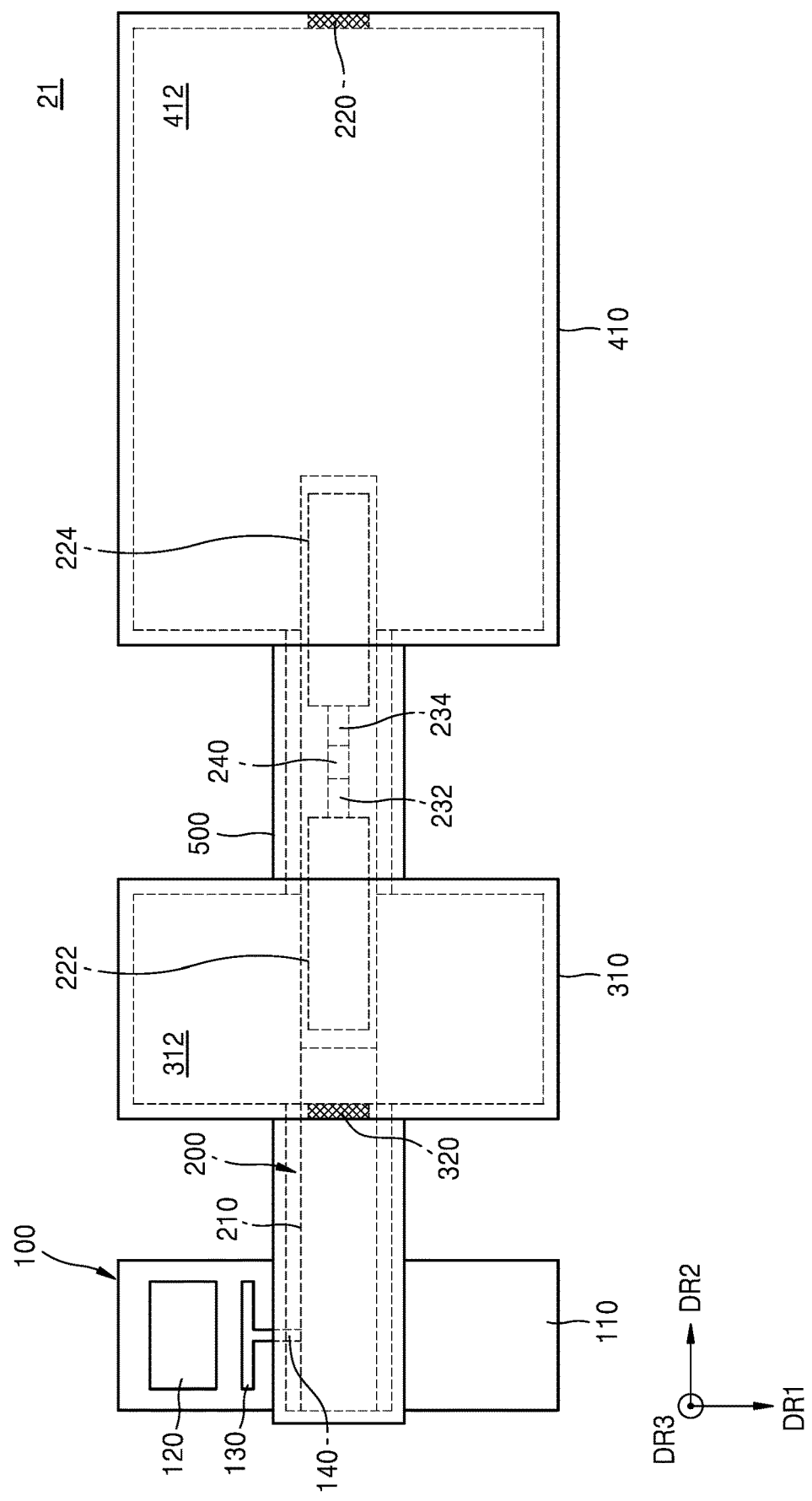
FIG. 10 is a plan view of the quantum computing device of FIG. 9.
Figure 11:
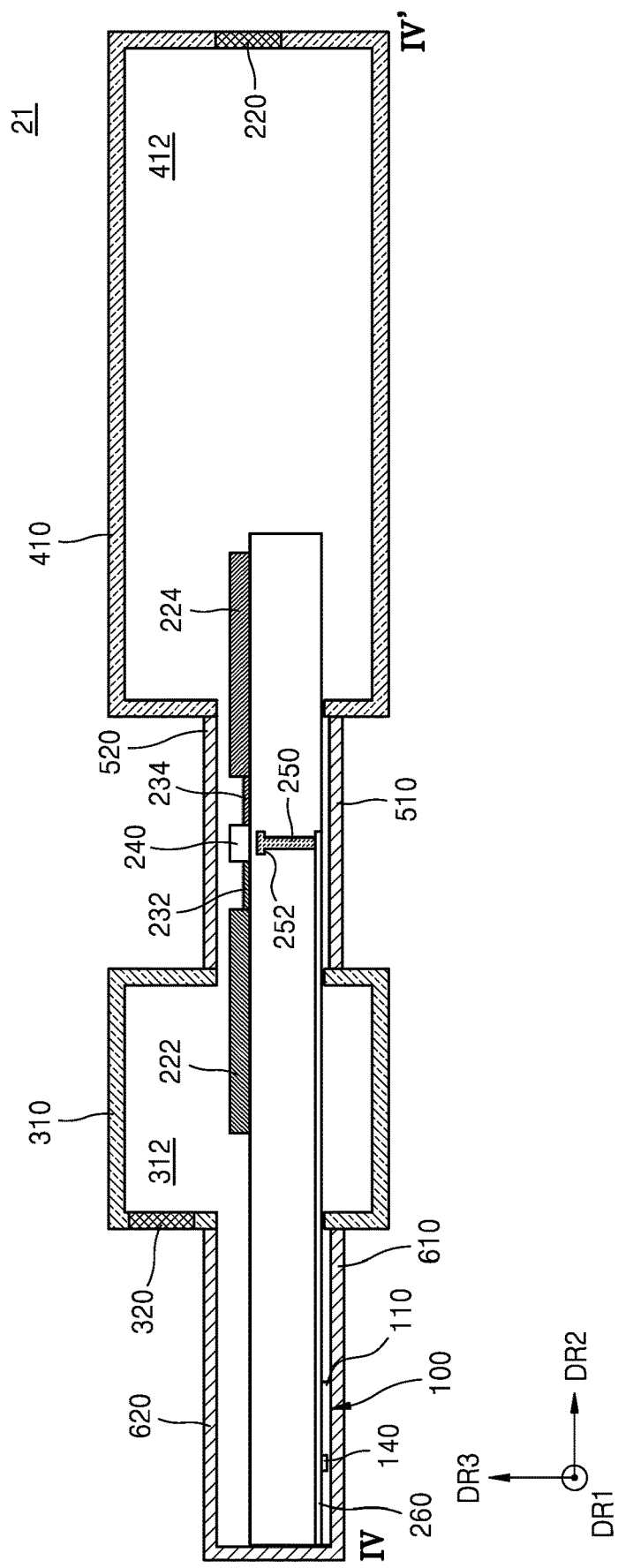
FIG. 11 is a cross-sectional view taken along line IV-IV' of the quantum computing device of FIG. 9.
Figure 12:
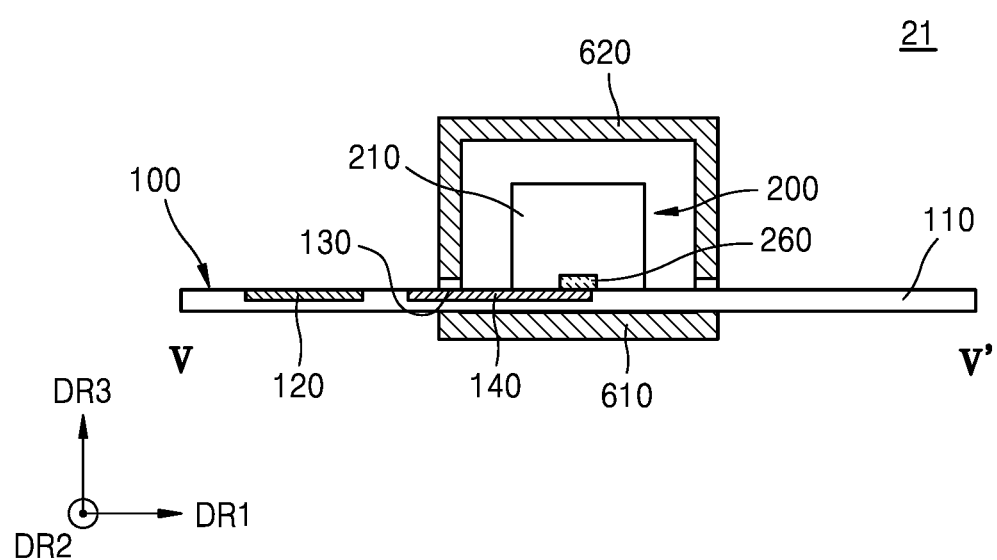
FIG. 12 is a cross-sectional view taken along line V-V of the quantum computing device of FIG. 9.

FIG. 9 is a perspective view of a quantum computing device according to one or more embodiments. FIG. 10 is a plan view of the quantum computing device of FIG. 9. FIG. 11 is a cross-sectional view taken along line IV-IV' of the quantum computing device of FIG. 9. FIG. 12 is a cross-sectional view taken along line V-V' of the quantum computing device of FIG. 9. For conciseness of description, descriptions as those given with reference to FIGS. 1 to 8 are applicable for same or related reference numbers, except where indicated otherwise, and accordingly descriptions from the same will not be repeated below.

Referring to FIGS. 9 to 12, a quantum computing device (or system) 21 may include a bus chip 100, a qubit chip 200, a readout cavity structure 310, a storage cavity structure 410, an inner shielding film 500, and an outer shielding film 600. The bus chip 100 may have a same configuration as the example configurations of the bus chip 100 described with reference to FIGS. 1 to 4, for example. The bus chip 100 may be disposed in the first direction DR1, and the qubit chip 200 may be disposed in a second direction, e.g., in a different second direction DR2, though the bus chip 100 with respect to FIGS. 9 to 12 does not overlap, or is not overlapped, with respect to the qubit chip 200. In the example of FIGS. 9 to 12, the bus chip 100 may be arranged in the second direction DR2 after an arrangement of the readout cavity structure 310 in the second direction DR2.

The qubit chip 200 may include a qubit board 210, a readout antenna 222, a storage antenna 224, a readout wiring 232, a storage wiring 234, a through wiring 250, a through pad 252, and a lower wiring 260. The readout antenna 222, the storage antenna 224, the readout wiring 232, the storage wiring 234, the through wiring 250, and the through pad 252 may be substantially the same as the readout antenna 222, the storage antenna 224, the readout wiring 232, the storage wiring 234, the through wiring 250, and the through pad 252 described with reference to FIGS. 1 to 4, respectively.

Similar to the above discussions in FIGS. 1 to 4 of connections of the transmission wiring 140 to the through wiring 250 of the qubit chip 200, the lower wiring 260 of FIGS. 9 to 12 is configured to connect to the transmission wiring 140 of the bus chip 100 to the through wiring 250 of the qubit chip 200, e.g., as the bus chip 100 and the qubit element 240 of the qubit chip 200 are separated in the example of FIGS. 9 to 12 the lower wiring 260 may be used to connect the transmission wiring 140 to the through wiring 250. For example, the qubit board 210 may extend from the bus chip 100 into the storage cavity 412 in the second direction DR2, where an example one of both end parts in the second direction DR2 of the qubit board 210 may be disposed on the bus chip 100 while the other end may be disposed within the storage cavity 412. The qubit board 210 may be configured to penetrate a pair of sidewalls, e.g., facing each other, in the readout cavity structure 310 in the second direction DR2. As a non-limiting example, the sidewall of the readout cavity structure 310 facing the bus chip 100 may be a sidewall in which the readout connector 320 is configured or buried. Herein, while examples exist with respect to any board or chip, as non-limiting examples, penetrating a fully or partially formed cavity structure or shielding film, such examples are also inclusive of examples where such cavity structures or shielding film are formed with respect to any existing structures of such a board or chip to result in such access or penetration. As another example, examples herein with respect to connectors being configured in or at a sidewall or cavity structure, may also include the connectors being buried in the sidewall or cavity structure.

Connecting the transmission wiring 140 to the through wiring 250 of the qubit chip 200, the lower wiring 260 may be provided below the qubit board 210. For example, the lower wiring 260 may transit or extend along the bottom of the qubit board 210, and in an example may be buried within an underside of the qubit board 210, e.g., until the through wiring 250 is reached below the qubit element 240. For example, the lower wiring 260 may extend in the second direction DR2. In an example, the lower wiring 260 may directly contact the transmission wiring 140 and directly contact the through wiring 250.

An inner shielding film 500 surrounding the qubit chip 200 may be provided between the readout cavity structure 310 and the storage cavity structure 410. The inner shielding film 500 may be substantially the same as the inner shielding film 500 described with reference to FIGS. 1 to 4.

An outer shielding film 600 may be provided from upper and lower sides, for example, of the readout cavity structure 310 facing the bus chip 100 to cover the bus chip 100 and the qubit chip 200. The outer shielding film 600 may surround the bus chip 100 and the qubit chip 200, e.g., covering respective upper and lower surfaces. In an example, the outer shielding film 600 may further completely cover the end part of the qubit chip 200, e.g., thereby encapsulating the bus chip 100 and the entirety of the portions of the qubit chip 200 extending beyond the readout cavity structure 310. The outer shielding film 600 may include a superconducting material. For example, the outer shielding film 600 may include aluminum (Al), niobium (Nb), indium (In), or a combination thereof, as non-limiting examples.

Thus, in accordance with one or more embodiments and descriptions of FIGS. 1 to 12, as well as the below discussions with respect to FIGS. 13 to 16, a quantum computing device may include a bus chip, extending in a first direction, and qubit chip being disposed on the bus chip and extending in a second direction and reaching into the readout cavity structure and reaching into the storage cavity structure. Similar to the above descriptions with respect to the bus chip being arranged with respect to a readout cavity structure, examples include the bus chip being arranged with respect to the readout cavity with respect to the readout cavity structure, though another side of the readout cavity structure than the discussions with respect to FIGS. 1 to 4, and a qubit chip disposed on the bus chip and reaching into the readout cavity structure and reaching into the storage cavity structure. Examples include plural qubit chips, readout cavities, and storage cavities, and thereby may provide a quantum computing device or system with high structural scalability.

Figure 13:
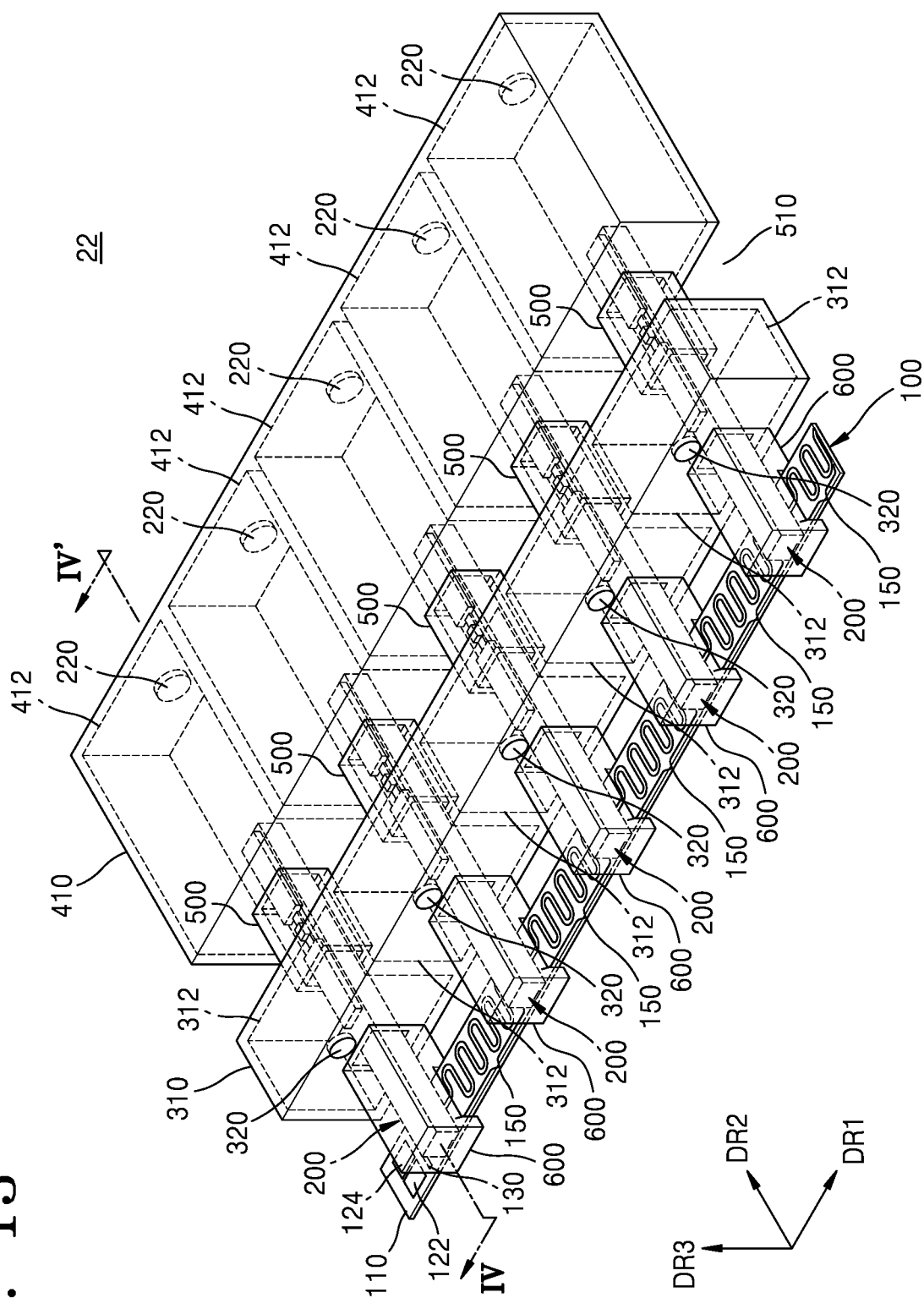
FIG. 13 is a perspective view of a quantum computing device according to one or more embodiments.
Figure 14:
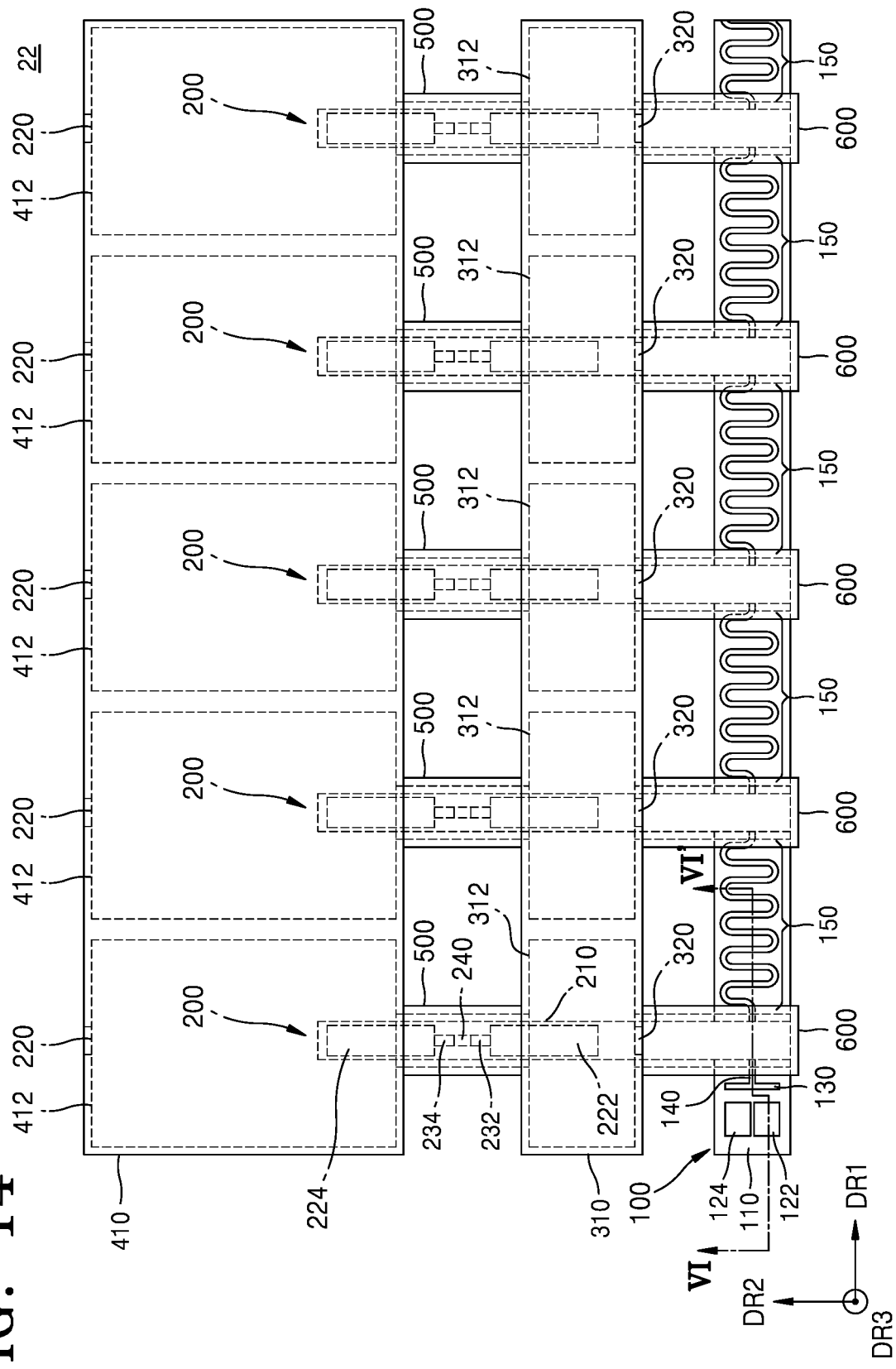
FIG. 14 is a plan view of the quantum computing device of FIG. 13.
Figure 15:
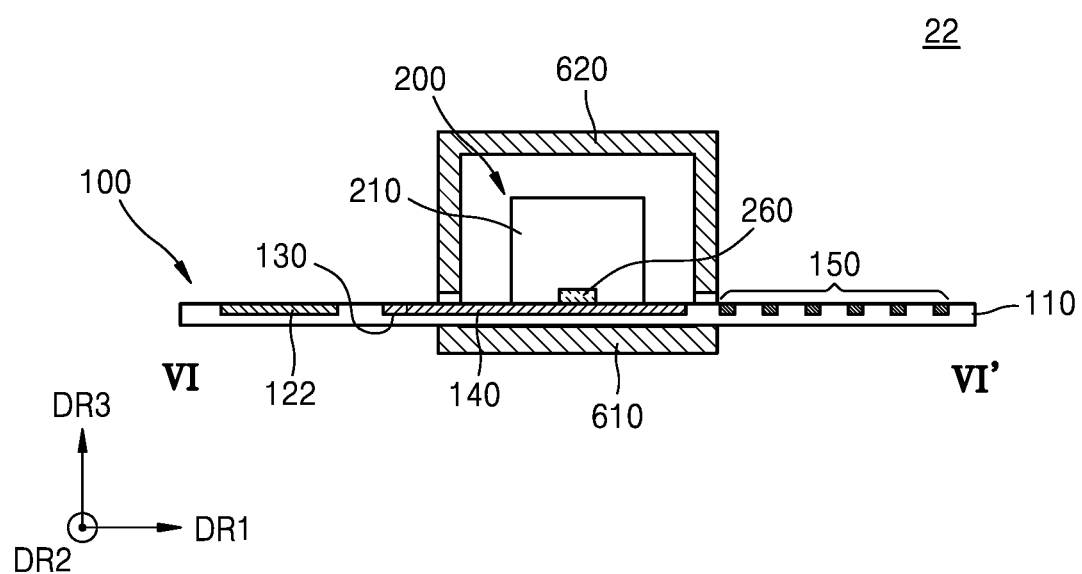
FIG. 15 is a cross-sectional view taken along line VI-VI' of the quantum computing device of FIG. 14.

FIG. 13 is a perspective view of a quantum computing device according to one or more embodiments. FIG. 14 is a plan view of the quantum computing device of FIG. 13. FIG. 15 is a cross-sectional view taken along line VI-VI' of the quantum computing device of FIG. 14. For conciseness of description, descriptions as those given with reference to FIGS. 9 to 12 are applicable for same or related reference numbers, except where indicated otherwise, and accordingly descriptions from the same will not be repeated below.

Referring to FIGS. 13 to 15, a quantum computing device (or system) 22 may include a bus chip 100, qubit chips 200, a readout cavity structure 310, a storage cavity structure 410, inner shielding films 500, and outer shielding films 600. The bus chip 100 may include a bus board 110, a first connection pad 122, a second connection pad 124, a transmission pad 130, a transmission wiring 140, and high-frequency resonators 150. The bus board 110, the first connection pad 122, the transmission pad 130, and the transmission wiring 140 may be substantially the same as the bus board 110, the connection pad 120, the transmission pad 130, and the transmission wiring 140 described with reference to FIGS. 9 to 12, respectively, and related to the bus chip 100 of FIGS. 5 to 8, the description of which is also applicable in view of the disclosure of FIGS. 9 to 12 and the below.

The second connection pad 124 may be a bonding area, as a non-limiting example, configured for connection/bonding with a connection wire connecting the bus chip 100 of the quantum computing device 22 to the bus chip of another quantum computing device other than the quantum computing device 22. The second connection pad 124 may include a superconducting material. For example, the second connection pad 124 may include aluminum (Al), niobium (Nb), indium (In), or a combination thereof, as non-limiting examples.

The high-frequency resonators 150 may be provided between the qubit chips 200, respectively. The high-frequency resonators 150 may each include LC resonators for electromagnetic signals having high frequencies. The high-frequency resonators 150 may include elements and configurations for forming quantum entanglement between the respective qubits of the qubit chips 200. The shape, arrangement, or form of each of the high-frequency resonators 150 is not limited to that shown. Various shapes, arrangements, and forms of the high-frequency resonators 150 are included in examples, having respective LC resonator functions for various electromagnetic signals having high frequencies. The high-frequency resonators 150 may be sequentially arranged in the first direction DR1. The high-frequency resonators 150 may be electrically connected in series with each other. For example, the high-frequency resonators 150 directly adjacent to each other may directly contact each other. The respective transmission wirings 140 and the high-frequency resonators 150 directly adjacent to each other may be electrically connected. For example, the respective transmission wirings 140 and the high-frequency resonators 150 directly adjacent to each other may directly contact each other.

The qubit chips 200 may be sequentially arranged in the first direction DR1, respectively disposed between the high-frequency resonators 150. Each of the qubit chips 200 may include a qubit board 210, a readout antenna 222, a storage antenna 224, a readout wiring 232, a storage wiring 234, a through wiring 250, a through pad 252, and a lower wiring 260. Each of the qubit chips 200 may be substantially the same as the qubit chip 200 described with reference to FIGS. 9 to 12. The lower wiring 260 may be electrically connected to the high-frequency resonators 150. For example, the lower wirings 260 may directly contact the areas to which the high-frequency resonators 150 directly adjacent to each other are connected. Adjacent connections, as well as the below discussions regarding the readout cavity structures, readout cavities, readout connectors, storage cavity structures, storage cavity, and storage connectors, storage are also related to the descriptions above with respect to FIGS. 5 to 7, the description also being incorporated with respect to the same reference numeral features in FIGS. 13 to 15.

The readout cavity structure 310 may include the respective readout cavities 312. Readout antennas 222 may be respectively disposed in the readout cavities 312. Although examples are illustrated with the readout cavities 312 being arranged in one readout cavity structure 310, examples are not limited thereto. In another example, the readout cavities 312 may be disposed within a plurality of readout cavity structures, respectively.

Readout connectors 320 may be respectively provided in or at the readout cavity structure 310. For example, each readout connector 320 may be configured to access, pass through, or penetrate the readout cavity structure 310, such as discussed above. Thus, the readout connectors 320 may each provide a capability to access respective readout cavities 312. The readout connectors 320 may be spaced apart from the qubit boards 210 in the third direction DR3, e.g., the readout connectors 320 may be slightly misaligned in the third direction DR3 of the readout antenna 222. However, the location and spacing of the readout connectors 320 are not limited herein. The readout connectors 320 may be capacitively coupled to the readout antennas 222, respectively.

The storage cavity structure 410 may include the storage cavities 412. The storage antennas 224 may be respectively disposed in the storage cavities 412. Although examples are illustrated with the storage cavities 412 being arranged in one storage cavity structure 410, examples are not limited thereto. For example, in another embodiment, the storage cavities 412 may be disposed within a plurality of storage cavity structures, respectively.

Storage connectors 220 may be respectively provided in or at the storage cavity structure 410. For example, each storage connector 220 may be configured to access, pass through, or penetrate the storage cavity structure 410, such as discussed above. Thus, the storage connectors 220 may each provide a capability to access respective storage cavities 412. The storage connectors 220 may face or be aligned with storage antennas 224 in the second direction DR2, respectively. The storage connectors 220 may be capacitively coupled to the storage antennas 224, respectively.

Inner shielding films 500 may be provided between the readout cavity structure 310 and the storage cavity structure 410. The inner shielding films 500 may respectively cover the qubit chips 200.

The outer shielding films 600 may be provided to respectively cover the qubit chips 200. For example, the outer shielding films 600 may completely cover end parts of the qubit chips 200, respectively. The bus chip 100 may extend to penetrate the outer shielding films 600. The high-frequency resonators 150 may be exposed between the outer shielding films 600.

Quantum entanglement may occur between qubits of the quantum computing device 22.

Thus, in accordance with one or more embodiments and descriptions of FIGS. 1 to 15, as well as the below description of FIG. 16, a quantum computing device may include a plurality of qubit chips, readout cavities, and storage cavities arranged in a first direction. Plural qubit chips, plural readout cavities, and plural storage cavities may be provided, noting that examples of the present disclosure are not limited thereto. Various numbers of qubit chips, readout cavities, and storage cavities are available in various examples. Accordingly, various embodiments of the present disclosure may provide quantum computing devices or systems with high structural scalability.

Figure 16:
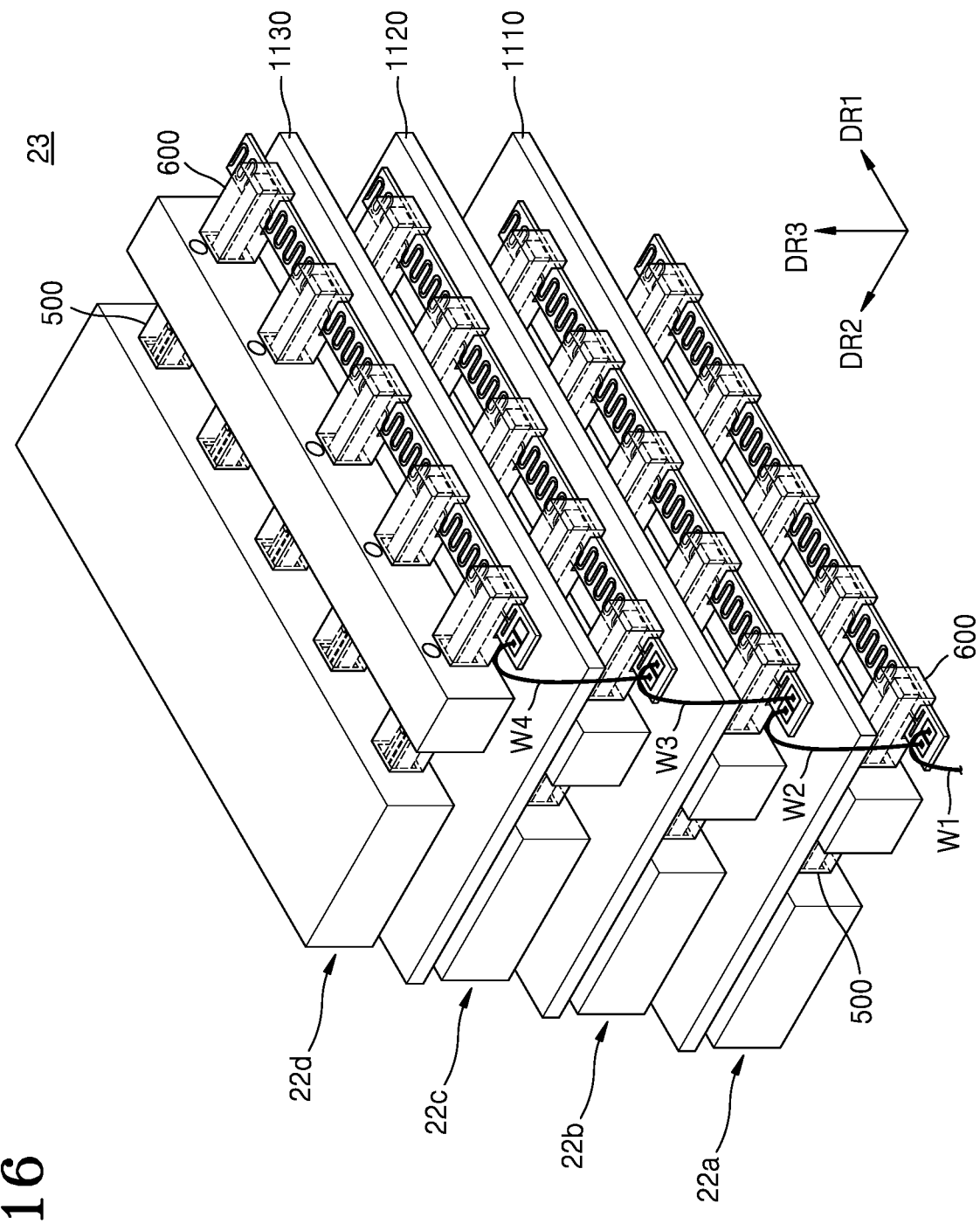
FIG. 16 is a perspective view of a quantum computing device according to one or more embodiments.

FIG. 16 is a perspective view of a quantum computing device according to one or more embodiments. For conciseness of description, descriptions as those given with reference to FIGS. 8 to 15 are applicable for same or related reference numbers, except where indicated otherwise, and accordingly descriptions from the same will not be repeated below.

Referring to FIG. 16, a quantum computing device (or system) 23 may include a first sub-quantum computing device 22a, a second sub-quantum computing device 22b, a third sub-quantum computing device 22c, a fourth sub-quantum computing device 22d, a first interlayer shielding film 1110, a second interlayer shielding film 1120, a third interlayer shielding film 1130, a first wire W1, a second wire W2, a third wire W3, and a fourth wire W4. Any or all of the first to fourth sub-quantum computing devices 22a, 22b, 22c, and 22d may respectively be substantially the same as the quantum computing device 22 described with reference to FIGS. 13 to 15, with stepping or stacking of quantum computing devices and connection between quantum computing devices also being related to the disclosure of FIG. 8, descriptions of which, in view of the below, are incorporated.

The first to fourth sub-quantum computing devices 22a, 22b, 22c, and 22d may be stacked in the third direction DR3. The first to fourth sub-quantum computing devices 22a, 22b, 22c, and 22d may be arranged in a stair or stacked form. From the viewpoint in the third direction DR3, the first connection pad 122 and the second connection pad 124 of the sub-quantum computing device (e.g., the first sub-quantum computing device 22a) disposed at a low position may be partially exposed by a sub-quantum computing device (e.g., the second sub-quantum computing device 22b) stacked or disposed at a higher position.

The first to third interlayer shielding films 1110, 1120, and 1130 may be disposed between the first to fourth sub-quantum computing devices 22a, 22b, 22c, and 22d. The first to third interlayer shielding films 1110, 1120, and 1130 may be configured to block unintended electromagnetic waves from being transmitted and received respectively between any of the first to fourth sub-quantum computing devices 22a, 22b, 22c, and 22d. The first to third interlayer shielding films 1110, 1120, and 1130 may be or include a superconducting material. For example, the first to third interlayer shielding films 1110, 1120, and 1130 may each include aluminum (Al), niobium (Nb), indium (In), or a combination thereof, as non-limiting examples.

In an example, the first wire W1 electrically connects a high frequency electric signal generation device outside the quantum computing device (system) 23, or outside the first to fourth sub-quantum computing devices 22a, 22b, 22c, and 22d, an also connected to the first connection pad 122 of the first sub-quantum computing device 22a, thereby receiving the high frequency electric signal. The first wire W1 may apply the electrical signal generated by the high frequency electrical signal generation device to any one of the first connection pad 122 and the second connection pad 124 of the first sub-quantum computing device 22a. The quantum computing device and system examples herein of FIGS. 1 to 7 and FIGS. 9 to 15 may similarly receive a high frequency electric signal from a high frequency generation device, e.g., with receipt by connection pads 120 with respect to FIGS. 1 to 4 and FIGS. 9 to 12, or by the first connection pad 122 with respect to FIGS. 5 to 7 and FIGS. 13 to 15. As respective non-limiting examples, the high frequency generation device may be provided from outside of any of the quantum computing devices or system of FIGS. 1 to 7 and FIGS. 9 to 15.

The second wire W2 may electrically connect the other of the first connection pad 122 and the second connection pad 124 of the first sub-quantum computing device 22a to any one of the connection pad 122 and the second connection pad 124 of the second sub-quantum computing device 22b.

The third wire W3 may electrically connect the other of the first connection pad 122 and the second connection pad 124 of the second sub-quantum computing device 22b to any one of the first connection pad 122 and the second connection pad 124 of the third sub-quantum computing device 22c.

The fourth wire W4 may electrically connect the other of the first connection pad 122 and the second connection pad 124 of the third sub-quantum computing device 22c to any one of the first connection pad 122 and the second connection pad 124 of the fourth sub-quantum computing device 22d.

The second to fourth wires W2, W3, and W4 may provide electrical signals generated by the high-frequency electric signal generation device to the second to fourth sub-quantum computing devices 22b, 22c, and 22d, respectively. The first to fourth wires W1, W2, W3, and W4 may include a superconducting material. For example, the first to fourth wires W1, W2, W3, and W4 may each include aluminum (Al), niobium (Nb), indium (In), or a combination thereof, as non-limiting examples.

Quantum entanglement may occur between qubits of the quantum computing device 23.

As discussed above respect to FIGS. 1 to 16, a quantum computing system may include a plurality of quantum computing devices, e.g., stacked in a third direction. Each of the plural quantum computing devices may include a plurality of qubit chips, readout cavities, and storage cavities arranged in a first direction. While plural quantum computing devices are discussed for explanation, embodiments are not limited thereto. The number of qubit chips in any one of the stacked quantum computing devices is not limited to the example disclosure herein, the number of qubit chips are not required to be the same in different steps of quantum computing devices, and the number of steps of quantum computing devices also are not limited to the disclosure herein, as various examples exist with various number of steps. Thus, one or more embodiments demonstrate examples that may provide a quantum computing system or device with high structural scalability.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or components are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A quantum computing device comprising:
   a first qubit chip;
   a readout cavity structure surrounding a first end part of the first qubit chip; and
   a storage cavity structure surrounding a second end part of the first qubit chip;
   wherein the first qubit chip comprises:
      a first readout antenna disposed in the readout cavity structure;
      a first storage antenna disposed in the storage cavity structure; and
      a first qubit element provided between the first readout antenna and the first storage antenna, and
   wherein the first qubit element is disposed between the readout cavity structure and the storage cavity structure, and the readout cavity structure is spaced apart from the storage cavity structure.

2. The quantum computing device of claim 1, wherein the first qubit chip further comprises:
   a first through pad facing the first qubit element; and
   a first through wiring electrically connecting to the first through pad, and
   wherein the first through pad is closer to the first qubit element than the first through wiring is to the first qubit element.

3. The quantum computing device of claim 2, further comprising a bus chip provided between the readout cavity structure and the storage cavity structure,
   wherein the bus chip comprises:
      a connection pad configured to receive an electrical signal from outside the bus chip;
      a transmission pad facing the connection pad; and
      a transmission wiring electrically connected to the transmission pad,
   wherein the transmission wiring is electrically connected to the first through wiring.

4. The quantum computing device of claim 3, wherein the transmission pad is configured to capacitively couple with the connection pad with respect to the received electrical signal.

5. The quantum computing device of claim 3, wherein the first qubit chip further comprises:
   a first readout wiring electrically connecting the first readout antenna to the first qubit element;
   a first storage wiring electrically connecting the first storage antenna to the first qubit element; and
   a first qubit board provided on the bus chip, and
   wherein the first qubit element, the first readout antenna, the first readout wiring, the first storage antenna, and the first storage wiring are provided on the first qubit board.

6. The quantum computing device of claim 5,
   wherein the first qubit element comprises a first superconducting material pattern, a dielectric film, and a second superconducting material pattern that are sequentially stacked, and
   wherein the first superconducting material pattern, the dielectric layer, and the second superconducting material pattern constitute a Josephson junction.

7. The quantum computing device of claim 6,
   wherein the first superconducting material pattern is electrically connected to the first readout antenna by the first readout wiring, and
   wherein the second superconducting material pattern is electrically connected to the first storage antenna by the first storage wiring.

8. The quantum computing device of claim 6, wherein the first through pad is configured to capacitively couple with the second superconducting material pattern.

9. The quantum computing device of claim 3, further comprising a second qubit chip spaced apart from the first qubit chip,
   wherein the second qubit chip further comprises:
      a second readout antenna disposed in the readout cavity structure;
      a second storage antenna disposed in the storage cavity structure;
      a second qubit element provided between the second readout antenna and the second storage antenna;
      a second through pad facing the second qubit element; and
      a second through wiring electrically connecting to the second through pad, with the second through pad being closer to the second qubit element than the second through wiring is to the second qubit element, and
   wherein the second qubit element is disposed between the readout cavity structure and the storage cavity structure.

10. The quantum computing device of claim 9,
    wherein the bus chip further comprises a high-frequency resonator provided between the first qubit chip and the second qubit chip, and
    wherein the first qubit element and the second qubit element are each coupled to the high-frequency resonator.

11. The quantum computing device of claim 10,
    wherein the transmission wiring is electrically connected to the high-frequency resonator, and
    wherein both ends of the high-frequency resonator are electrically connected to the first through wiring and the second through wiring, respectively.

12. The quantum computing device of claim 9,
    wherein the bus chip, the first and second qubit chips, the readout cavity structure, and the storage cavity structure are arranged in a lower sub-quantum computing device,
    wherein the quantum computing device further comprises, in an upper sub-quantum computing device that is provided on the lower sub-quantum computing device, another bus chip having a configuration of the bus chip, another first and second qubit chips having respective configurations of the first and second qubit chips, another readout cavity structure having a configuration of the readout cavity structure, and another storage cavity structure having a configuration of the storage cavity structure, and
wherein the lower sub-quantum computing device is connected by a connection wire to the upper sub-quantum computing device.

13. The quantum computing device of claim 12,
wherein each of the lower sub-quantum computing device and the upper sub-quantum computing device include respective high-frequency resonators configured to form quantum entanglement between all qubits of the lower sub-quantum computing device and the upper sub-quantum computing device.

14. The quantum computing device of claim 1, further comprising a bus chip provided between the readout cavity structure and the storage cavity structure.

15. The quantum computing device of claim 1, further comprising a bus chip, wherein the bus chip is arranged adjacent to an exterior facing sidewall of the readout cavity structure, the first qubit element is configured between an interior facing sidewall of the readout cavity structure and an interior facing sidewall of the storage cavity structure, and the bus chip is spatially distant from the first qubit element.

16. The quantum computing device of claim 15, further comprising a second qubit chip spaced apart from the first qubit chip, the second qubit chip including a second qubit element arranged between the interior facing sidewall of the readout cavity structure and the interior facing sidewall of the storage cavity structure, and spatially distant from the bus chip,
wherein the second qubit chip further comprises:
a second readout antenna disposed in the readout cavity structure; and
a second storage antenna disposed in the storage cavity structure.

17. The quantum computing device of claim 16, wherein the first and second qubit chips comprise respective through wirings, configured to provide electrical contact from the bus chip to respective through pads of the first and second qubit chips, and
wherein the respective through pads are configured to capacitively couple with respective superconducting material patterns of the first and second qubit elements.

18. The quantum computing device of claim 1, further comprising a first connector coupled to the first readout antenna,
wherein the first connector is configured as an insertion into the readout cavity structure.

19. The quantum computing device of claim 18, wherein the first connector and the first readout antenna face each other.

20. The quantum computing device of claim 1, wherein the readout cavity structure and the storage cavity structure comprise a superconducting material.

21. The quantum computing device of claim 1,
wherein the first readout antenna extends toward the first qubit element such that a portion of the first readout antenna is disposed between the readout cavity structure and the storage cavity structure, and
wherein the first storage antenna extends toward the first qubit element such that a portion of the first storage antenna is disposed between the readout cavity structure and the storage cavity structure.

22. The quantum computing device of claim 1, further comprising a shielding film surrounding the first qubit chip between the readout cavity structure and the storage cavity structure,
wherein the shielding film comprises a superconducting material.

23. A quantum computing device comprising:
a bus chip extending in a first direction;
a storage cavity structure spaced apart from the bus chip in a second direction intersecting with the first direction;
a readout cavity structure provided between the bus chip and the storage cavity structure; and
plural qubit chips sequentially arranged in the first direction on the bus chip,
wherein the plural qubit chips respectively extend into the storage cavity structure in the second direction, including respectively extending through the readout cavity structure,
wherein the plural qubit chips each comprise a respective readout antenna disposed in the readout cavity structure, a respective storage antenna disposed in the storage cavity structure, and a respective qubit element provided between the respective readout antenna and the respective storage antenna,
wherein the bus chip comprises plural high-frequency resonators provided respectively between the plural qubit chips, and
wherein each of the respective qubit elements are coupled with a respective high-frequency resonator of the plural high-frequency resonators.

24. The quantum computing device of claim 23,
wherein the readout cavity structure comprises plural readout cavities arranged in the first direction,
wherein the storage cavity structure comprises plural storage cavities arranged in the first direction,
wherein the respective readout antennas are respectively disposed in the plural readout cavities,
wherein the respective storage antennas are respectively disposed in the plural storage cavities,
wherein, within each of the plural qubit chips, the respective readout antenna and the respective qubit element are electrically connected to each other, and
wherein, within each of the plural qubit chips, the respective storage antenna and the respective qubit element are electrically connected to each other.

25. The quantum computing device of claim 24, further comprising respective connectors coupled to the respective readout antennas,
wherein the respective connectors are each configured as an insertion into the readout cavity structure to a corresponding readout cavity of the plural readout cavities.

26. The quantum computing device of claim 23, wherein each of the plural qubit chips comprises:
a through wiring coupled with a corresponding qubit element; and
a connection wiring disposed between the through wiring and a corresponding high-frequency resonator, of the plural high-frequency resonators, and configured to electrically connect the through wiring to the corresponding high-frequency resonator.

27. The quantum computing device of claim 26, wherein, for each of the plural qubit chips, the connection wiring extends in the second direction from a respective area on the bus chip to a respective area between the readout cavity structure and the storage cavity structure.

28. The quantum computing device of claim 26, wherein the bus chip further comprises:
- a connection pad;
- a transmission pad facing the connection pad; and
- a transmission wiring provided between the transmission pad and a high-frequency resonator of the plural high-frequency resonators, and
- wherein the transmission wiring is electrically connected to the transmission pad, the high-frequency resonator, and the through wiring corresponding to a qubit chip of the plural qubit chips.

29. The quantum computing device of claim 23, wherein the respective qubit elements are disposed between the readout cavity structure and the storage cavity structure.

30. The quantum computing device of claim 23, further comprising:
- an inner shielding film surrounding each of the plural qubit chips between the readout cavity structure and the storage cavity structure; and
- an outer shielding film collectively surrounding, for each one of the plural qubit chips, the bus chip and the each one of the plural qubit chips,
- wherein the inner shielding film and the outer shielding film comprise a superconducting material.

31. A quantum computing device comprising:
- a lower sub-quantum computing device comprising:
- a first readout cavity structure and a first storage cavity structure respectively spaced apart from each other in a first direction; and
- plural first qubit chips each arranged in a second direction intersecting with the first direction;
- an upper sub-quantum computing device provided on the lower sub-quantum computing device and comprising:
- a second readout cavity structure and a second storage cavity structure respectively spaced apart from each other in the first direction; and
- plural second qubit chips each arranged in the second direction intersecting with the first direction; and
- a connection wire configured to electrically connect the lower sub-quantum computing device to the upper sub-quantum computing device,
- wherein each of the plural first qubit chips comprises a first readout antenna respectively provided in the first readout cavity structure, a first storage antenna respectively provided in the first storage cavity structure, and a respective first qubit element provided between the respectively provided first readout antenna and the respectively provided first storage antenna, and
- wherein each of the plural second qubit chips comprises a second readout antenna respectively provided in the second readout cavity structure, a second storage antenna respectively provided in the second storage cavity structure, and a respective second qubit element provided between the respectively provided second readout antenna and the respectively provided second storage antenna.

32. The quantum computing device of claim 31,
- wherein the lower sub-quantum computing device comprises a first bus chip extending in the second direction between the first readout cavity structure and the first storage cavity structure,
- wherein the upper sub-quantum computing device comprises a second bus chip extending in the second direction between the second readout cavity structure and the second storage cavity structure,
- wherein the first bus chip comprises:
- a first connection pad;
- a first transmission pad facing the first connection pad; and
- a first transmission wiring electrically connected to the first transmission pad,
- wherein the second bus chip comprises:
- a second connection pad;
- a second transmission pad facing the second connection pad; and
- a second transmission wiring electrically connected to the second transmission pad, and
- wherein the connection wire electrically connects the first connection pad and the second connection pad.

33. The quantum computing device of claim 31,
- wherein the lower sub-quantum computing device comprises a first bus chip extending in the second direction away from the second readout cavity structure and the second storage cavity structure,
- wherein the upper sub-quantum computing device comprises a second bus chip extending in the second direction away from the second readout cavity structure and the second storage cavity structure,
- wherein the first bus chip comprises:
- a first connection pad;
- a first transmission pad facing the first connection pad; and
- a first transmission wiring electrically connected to the first transmission pad,
- wherein the second bus chip comprises:
- a second connection pad;
- a second transmission pad facing the second connection pad; and
- a second transmission wiring electrically connected to the second transmission pad, and
- wherein the connection wire electrically connects the first connection pad and the second connection pad.

34. The quantum computing device of claim 31, wherein the connection wire comprises a superconducting material.

35. The quantum computing device of claim 31, further comprising an interlayer shielding film disposed between the lower sub-quantum computing device and the upper sub-quantum computing device,
- wherein the interlayer shielding film comprises a superconducting material.

* * * * *